(12) United States Patent
Zhang

(10) Patent No.: US 10,848,158 B2
(45) Date of Patent: *Nov. 24, 2020

(54) CONFIGURABLE PROCESSOR

(71) Applicant: Guobiao Zhang, Corvallis, OR (US)

(72) Inventor: Guobiao Zhang, Corvallis, OR (US)

(73) Assignees: HangZhou HaiCun Information Technology Co., Ltd., ZheJiang (CN); Guobiao Zhang, Corvallis, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/693,370

(22) Filed: Nov. 24, 2019

(65) Prior Publication Data
US 2020/0127665 A1 Apr. 23, 2020

Related U.S. Application Data

(63) Continuation-in-part of application No. 16/249,021, filed on Jan. 16, 2019, and a continuation-in-part of
(Continued)

(30) Foreign Application Priority Data

| Feb. 13, 2016 | (CN) | 2016 1 0083747 |
| Mar. 5, 2016 | (CN) | 2016 1 0125227 |
| Apr. 22, 2016 | (CN) | 2016 1 0260845 |
| May 2, 2016 | (CN) | 2016 1 0289592 |
| May 10, 2016 | (CN) | 2016 1 0307102 |
| Mar. 3, 2017 | (CN) | 2017 1 0122749 |
| Mar. 6, 2017 | (CN) | 2017 1 0126067 |
| Apr. 12, 2017 | (CN) | 2017 1 0237780 |
| Oct. 19, 2017 | (CN) | 2017 1 0980620 |

(Continued)

(51) Int. Cl.
G06F 7/38 (2006.01)
H03K 19/173 (2006.01)
(Continued)

(52) U.S. Cl.
CPC .......... H03K 19/1776 (2013.01); G11C 5/02 (2013.01); H03K 19/1737 (2013.01);
(Continued)

(58) Field of Classification Search
None
See application file for complete search history.

(56) References Cited

U.S. PATENT DOCUMENTS 4,870,302 A 9/1989 Freeman
5,046,038 A 9/1991 Briggs et al.
(Continued)

OTHER PUBLICATIONS

Harrison et al., "The Computation of Transcendental Functions on the IA-64 Architecture", Intel Technical Journal, Q4, 1999.
(Continued)

Primary Examiner — Anh Q Tran

(57) ABSTRACT

A configurable processor comprises at least an array of configurable computing elements (CCE's). Each CCE comprises at least a three-dimensional (3-D) memory (3D-M) array; an arithmetic logic circuit (ALC); and, a plurality of inter-storage-processor (ISP) connections. Not penetrating through any semiconductor substrate, the ISP-connections are short, small and numerous.

19 Claims, 17 Drawing Sheets

Related U.S. Application Data application No. 16/186,571, filed on Nov. 11, 2018, now Pat. No. 10,700,686, which is a continuation-in-part of application No. 16/059,023, filed on Aug. 8, 2018, now Pat. No. 10,312,917, application No. 16/693,370, which is a continuation-in-part of application No. 16/055,170, filed on Aug. 6, 2018, now abandoned, said application No. 16/059,023 is a continuation-in-part of application No. 15/793,968, filed on Oct. 25, 2017, now abandoned, said application No. 16/055,170 is a continuation-in-part of application No. 15/793,912, filed on Oct. 25, 2017, now Pat. No. 10,075,168, said application No. 16/059,023 is a continuation-in-part of application No. 15/793,912, and a continuation-in-part of application No. 15/793,933, filed on Oct. 25, 2017, now Pat. No. 10,141,939, and a continuation-in-part of application No. 15/793,927, filed on Oct. 25, 2017, now Pat. No. 10,075,169, application No. 16/693,370, which is a continuation-in-part of application No. 15/487,366, filed on Apr. 13, 2017, now Pat. No. 10,763,861, said application No. 15/793,927 is a continuation-in-part of application No. 15/450,049, filed on Mar. 6, 2017, now Pat. No. 9,838,021, said application No. 15/793,912 is a continuation of application No. 15/450,049, said application No. 15/793,968 is a continuation-in-part of application No. 15/450,049, said application No. 15/793,933 is a continuation-in-part of application No. 15/450,049, which is a continuation-in-part of application No. 15/450,017, filed on Mar. 5, 2017, now Pat. No. 9,948,306.

(30) Foreign Application Priority Data

| Date | | Number |
|---|---|---|
| Oct. 20, 2017 | (CN) | 2017 1 0980779 |
| Oct. 20, 2017 | (CN) | 2017 1 0980813 |
| Oct. 20, 2017 | (CN) | 2017 1 0980826 |
| Oct. 20, 2017 | (CN) | 2017 1 0980827 |
| Oct. 23, 2017 | (CN) | 2017 1 0989881 |
| Oct. 23, 2017 | (CN) | 2017 1 0989885 |
| Oct. 23, 2017 | (CN) | 2017 1 0989901 |
| Dec. 10, 2018 | (CN) | 2018 1 1506212 |
| Dec. 11, 2018 | (CN) | 2018 1 1508130 |
| Dec. 12, 2018 | (CN) | 2018 1 1520357 |
| Dec. 13, 2018 | (CN) | 2018 1 1527885 |
| Dec. 13, 2018 | (CN) | 2018 1 1527911 |
| Dec. 14, 2018 | (CN) | 2018 1 1528014 |
| Dec. 15, 2018 | (CN) | 2018 1 1546476 |
| Dec. 15, 2018 | (CN) | 2018 1 1546592 |
| Jan. 2, 2019 | (CN) | 2019 1 0002944 |
| Jan. 13, 2019 | (CN) | 2019 1 0029523 |

(51) Int. Cl.

| | |
|---|---|
| *H03K 19/1776* | (2020.01) |
| *G11C 5/02* | (2006.01) |
| *H03K 19/17728* | (2020.01) |
| *H03K 19/17736* | (2020.01) |

(52) U.S. Cl.

CPC . *H03K 19/17728* (2013.01); *H03K 19/17744* (2013.01); *G11C 5/025* (2013.01)

(56) References Cited

U.S. PATENT DOCUMENTS

| | | | |
|---|---|---|---|
| 5,060,182 | A | 10/1991 | Briggs et al. |
| 5,604,499 | A | 2/1997 | Miyagoshi et al. |
| 5,835,396 | A | 11/1998 | Zhang |
| 5,901,274 | A | 5/1999 | Oh |
| 5,954,787 | A | 9/1999 | Eun |
| 6,181,355 | B1 | 1/2001 | Brethour et al. |
| 6,263,470 | B1 | 7/2001 | Hung et al. |
| 7,028,247 | B2 | 4/2006 | Lee |
| 7,206,410 | B2 | 4/2007 | Bertoni et al. |
| 7,366,748 | B1 | 4/2008 | Tang et al. |
| 7,472,149 | B2 | 12/2008 | Endo |
| 7,512,647 | B2 | 3/2009 | Wilson et al. |
| 7,574,468 | B1 | 4/2009 | Rayala |
| 7,539,927 | B2 | 5/2009 | Lee et al. |
| 7,558,812 | B1 | 7/2009 | Padalia et al. |
| 7,634,524 | B2 | 12/2009 | Okutani et al. |
| 7,917,559 | B2 | 3/2011 | Redgrave |
| 7,962,543 | B2 | 6/2011 | Schulte et al. |
| 8,203,564 | B2 | 6/2012 | Jiao et al. |
| 8,438,522 | B1 | 5/2013 | Frederick et al. |
| 8,487,948 | B2 | 7/2013 | Kai et al. |
| 9,015,452 | B2 | 4/2015 | Dasgupta |
| 9,196,752 | B2 | 11/2015 | Baskaran et al. |
| 9,207,910 | B2 | 12/2015 | Azadet et al. |
| 9,225,501 | B2 | 12/2015 | Azadet |
| 9,465,580 | B2 | 10/2016 | Pineiro et al. |
| 9,606,796 | B2 | 3/2017 | Lee et al. |
| 2004/0044710 | A1 | 3/2004 | Harrison et al. |
| 2005/0071401 | A1 | 3/2005 | Clifton |
| 2006/0106905 | A1 | 5/2006 | Chren, Jr. |
| 2012/0068229 | A1 | 3/2012 | Bemanian et al. |
| 2012/0248595 | A1 | 10/2012 | Or-Bach et al. |
| 2012/0256653 | A1* | 10/2012 | Cordero ........... H03K 19/17752 326/16 |
| 2013/0021060 | A1* | 1/2013 | Or-Bach ............. H03K 17/687 326/41 |
| 2013/0185345 | A1 | 7/2013 | Tsadik et al. |
| 2014/0067889 | A1 | 3/2014 | Mortensen |
| 2014/0222883 | A1 | 8/2014 | Pineiro et al. |
| 2014/0300500 | A1 | 10/2014 | San et al. |
| 2016/0173101 | A1 | 6/2016 | Gao et al. |

OTHER PUBLICATIONS

Paul et al., "Reconfigurable Computing Using Content Addressable Memory for Improved Performance and Resource Usage", Design Automation Conference (DAC), pp. 786-791, 2008.

Karam et al, "Emerging Trends in Design and Applications of Memory-Based Computing and Content-Addressable Memories", Proceedings of the IEEE, vol. 103, issue 8, pp. 1311-1330, 2015.

Kim et al. "Design and Analysis o 3D-MAPS (3D Massively Parallel Processor with Stacked Memory)", IEEE Transactions on Computers, vol. 64, No. 1, pp. 112-125, Jan. 2015.

* cited by examiner

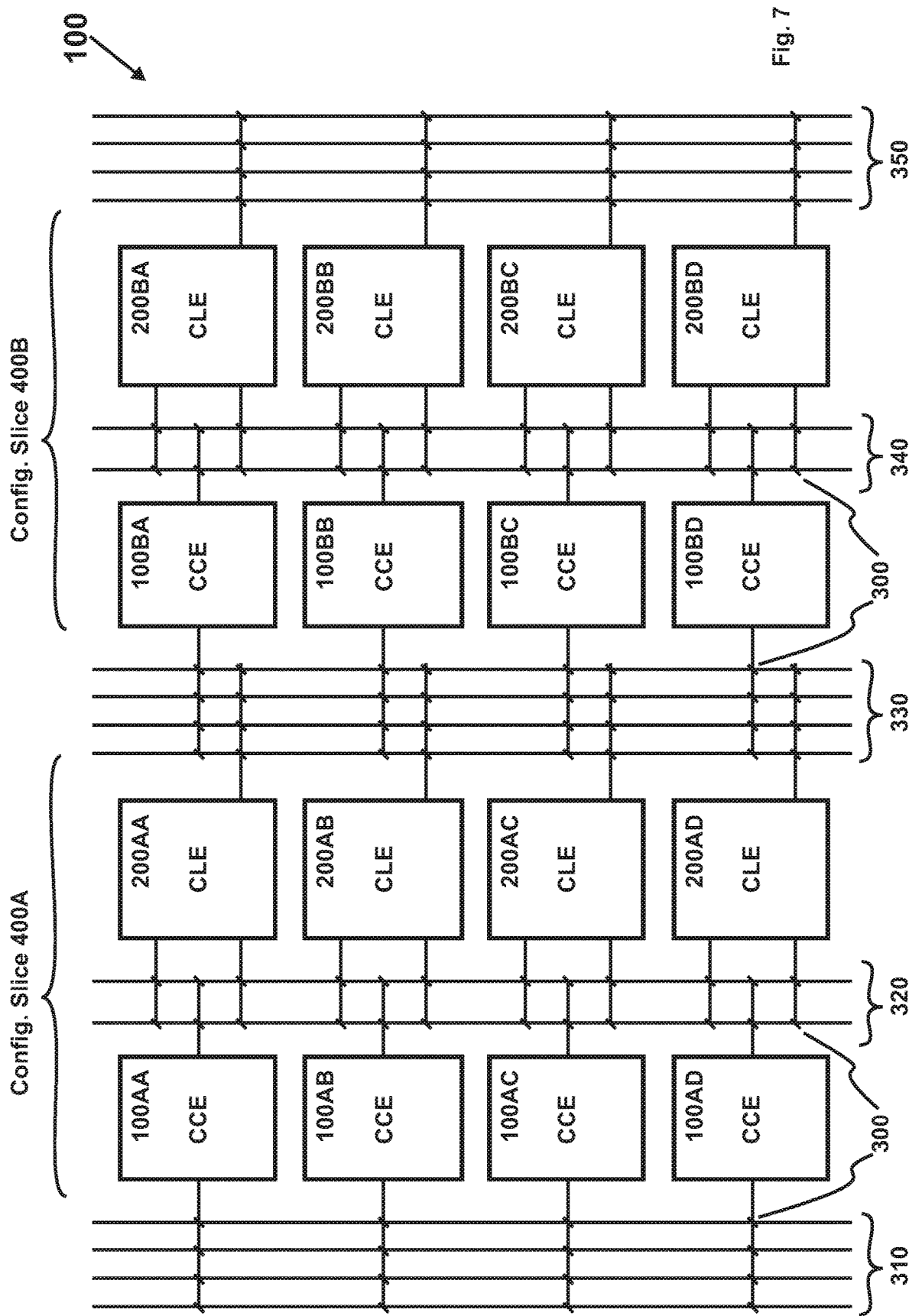

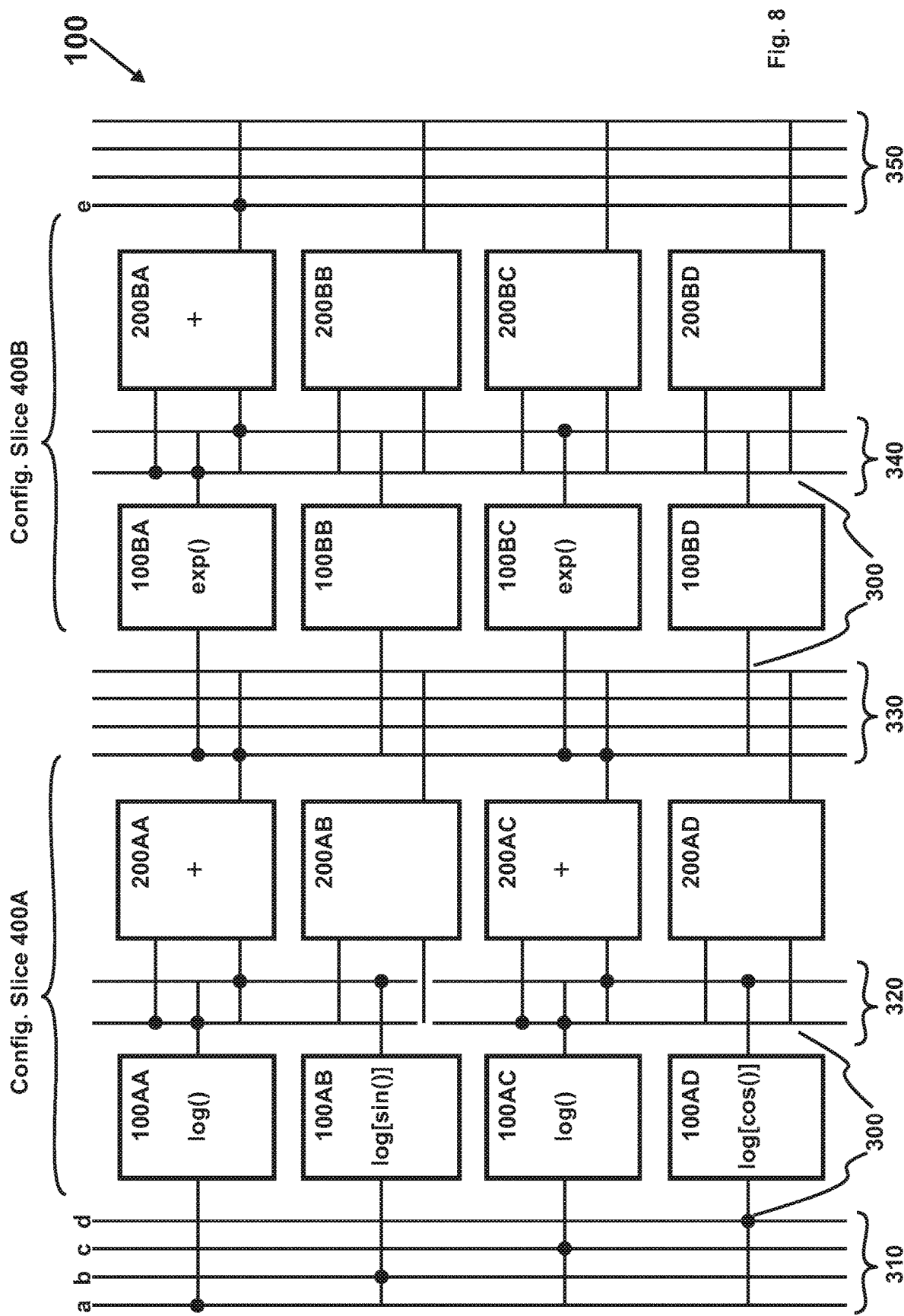

| # of ops. / Model Name | MOS3 | BSIM3 V3.2 | BSIM4 V3.0 | PSP |
|---|---|---|---|---|
| Addition | 46 | 283 | 222 | 1345 |
| Multiplication | 82 | 634 | 286 | 2319 |
| Division | 20 | 122 | 85 | 247 |
| Square Root | 4 | 9 | 16 | 30 |
| Exponential | 3 | 8 | 24 | 19 |
| Logarithmic | 0 | 1 | 19 | 10 |

CONFIGURABLE PROCESSOR

CROSS-REFERENCE TO RELATED APPLICATIONS

This application is a continuation-in-part of U.S. patent application Ser. No. 16/186,571, filed Nov. 11, 2018, which is a continuation-in-part of U.S. patent application Ser. No. 16/059,023, filed Aug. 8, 2018, now U.S. Pat. No. 10,312,917, issued Jun. 4, 2019, which is a continuation-in-part of the following U.S. Patent Applications (A)-(D):

(A) U.S. patent application Ser. No. 15/793,912, filed Oct. 25, 2017, now U.S. Pat. No. 10,075,168, issued Sep. 11, 2018, which is a continuation of U.S. patent application Ser. No. 15/450,049, filed Mar. 6, 2017, now U.S. Pat. No. 9,838,021, issued Dec. 5, 2017, which is a continuation-in-part of U.S. patent application Ser. No. 15/450,017, filed Mar. 5, 2017, now U.S. Pat. No. 9,948,306, issued Apr. 17, 2018;

(B) U.S. patent application Ser. No. 15/793,968, filed Oct. 25, 2017, now abandoned, which is a continuation-in-part of U.S. patent application Ser. No. 15/450,049, filed Mar. 6, 2017, now U.S. Pat. No. 9,838,021, issued Dec. 5, 2017, which is a continuation-in-part of U.S. patent application Ser. No. 15/450,017, filed Mar. 5, 2017, now U.S. Pat. No. 9,948,306, issued Apr. 17, 2018;

(C) U.S. patent application Ser. No. 15/793,927, filed Oct. 25, 2017, now U.S. Pat. No. 10,075,169, issued Sep. 11, 2018, which is a continuation-in-part of U.S. patent application Ser. No. 15/450,049, filed Mar. 6, 2017, now U.S. Pat. No. 9,838,021, issued Dec. 5, 2017, which is a continuation-in-part of U.S. patent application Ser. No. 15/450,017, filed Mar. 5, 2017, now U.S. Pat. No. 9,948,306, issued Apr. 17, 2018;

(D) U.S. patent application Ser. No. 15/793,933, filed Oct. 25, 2017, now U.S. Pat. No. 10,141,939, issued Nov. 27, 2018, which is a continuation-in-part of U.S. patent application Ser. No. 15/450,049, filed Mar. 6, 2017, now U.S. Pat. No. 9,838,021, issued Dec. 5, 2017, which is a continuation-in-part of U.S. patent application Ser. No. 15/450,017, filed Mar. 5, 2017, now U.S. Pat. No. 9,948,306, issued Apr. 17, 2018.

This application is also a continuation-in-part of U.S. patent application Ser. No. 16/055,170, filed Aug. 6, 2018, which is a continuation-in-part of U.S. patent application Ser. No. 15/793,912, filed Oct. 25, 2017, now U.S. Pat. No. 10,075,168, issued Sep. 11, 2018, which is a continuation of U.S. patent application Ser. No. 15/450,049, filed Mar. 6, 2017, now U.S. Pat. No. 9,838,021, issued Dec. 5, 2017, which is a continuation-in-part of U.S. patent application Ser. No. 15/450,017, filed Mar. 5, 2017, now U.S. Pat. No. 9,948,306, issued Apr. 17, 2018.

This application is further a continuation-in-part of U.S. patent application Ser. No. 15/487,366, filed Apr. 13, 2017; and, U.S. patent application Ser. No. 16/249,021, filed Jan. 16, 2019.

These patent applications claim priorities from the following Chinese Patent Applications:

1) Chinese Patent Application No. 201610083747.7, filed Feb. 13, 2016;
2) Chinese Patent Application No. 201610125227.8, filed Mar. 5, 2016;
3) Chinese Patent Application No. 201610260845.3, filed Apr. 22, 2016;
4) Chinese Patent Application No. 201610289592.2, filed May 2, 2016;
5) Chinese Patent Application No. 201610307102.7, filed May 10, 2016;
6) Chinese Patent Application No. 201710122749.7, filed Mar. 3, 2017;
7) Chinese Patent Application No. 201710126067.3, filed Mar. 6, 2017;
8) Chinese Patent Application No. 201710237780.5, filed Apr. 12, 2017;
9) Chinese Patent Application No. 201710980620.X, filed Oct. 19, 2017;
10) Chinese Patent Application No. 201710980779.1, filed Oct. 20, 2017;
11) Chinese Patent Application No. 201710980813.5, filed Oct. 20, 2017;
12) Chinese Patent Application No. 201710980826.2, filed Oct. 20, 2017;
13) Chinese Patent Application No. 201710980827.7, filed Oct. 20, 2017;
14) Chinese Patent Application No. 201710989881.8, filed Oct. 23, 2017;
15) Chinese Patent Application No. 201710989885.6, filed Oct. 23, 2017;
16) Chinese Patent Application No. 201710989901.1, filed Oct. 23, 2017;
17) Chinese Patent Application No. 201811506212.1, filed Dec. 10, 2018;
18) Chinese Patent Application No. 201811508130.0, filed Dec. 11, 2018;
19) Chinese Patent Application No. 201811520357.7, filed Dec. 12, 2018;
20) Chinese Patent Application No. 201811527885.5, filed Dec. 13, 2018;
21) Chinese Patent Application No. 201811527911.4, filed Dec. 13, 2018;
22) Chinese Patent Application No. 201811528014.5, filed Dec. 14, 2018;
23) Chinese Patent Application No. 201811546476.X, filed Dec. 15, 2018;
24) Chinese Patent Application No. 201811546592.1, filed Dec. 15, 2018;
25) Chinese Patent Application No. 201910002944.5, filed Jan. 2, 2019;
26) Chinese Patent Application No. 201910029523.1, filed Jan. 13, 2019, in the State Intellectual Property Office of the People's Republic of China (CN), the disclosure of which are incorporated herein by reference in their entireties.

BACKGROUND

1. Technical Field of the Invention

The present invention relates to the field of integrated circuit, and more particularly to configurable processor (also known as configurable gate array).

2. Prior Art

A conventional processor uses logic-based computing (LBC), which carries out computation primarily with logic circuits (e.g. XOR circuit). Logic circuits are suitable for arithmetic functions, whose operations involve only basic arithmetic operations. The basic arithmetic operations consist of addition "+", subtraction "−" and multiplication "*" only, which can be easily implemented by logic circuits. However, logic circuits are not suitable for non-arithmetic functions, which cannot be expressed in terms of a finite number of arithmetic operations. Exemplary non-arithmetic functions include transcendental functions and special functions. Non-arithmetic functions are computationally hard and their hardware implementation has been a major challenge. Unless indicated otherwise, the term "mathematical functions" are limited to non-arithmetic functions in this specification.

A complex mathematical function is a mathematical function with multiple independent variables (an independent variable is also known as an input variable or an argument). It can be expressed as a combination of basic mathematical functions. A basic mathematical function is a mathematical function with a single independent variable. Exemplary basic mathematical functions include basic transcendental functions, such as exponential function (exp), logarithmic function (log), trigonometric functions (sin, cos, tan, atan) and others.

On the conventional processor, the basic mathematical functions which can be calculated by hardware (i.e. hardware computing) are referred to as built-in mathematical functions. Because different mathematical functions are implemented with different logic circuits, the hardware implementation of the built-in mathematical functions is highly customized. Due to limited resources on a processor die, only a small number of the built-in mathematical functions can be implemented by hardware. For example, only 7 built-in mathematical functions (i.e. CBRT, EXP, LN, SIN, COS, TAN, ATAN) are implemented by hardware on an Intel IA-64 processor (referring to Harrison et al. "The Computation of Transcendental Functions on the IA-64 Architecture", Intel Technology Journal, Q4, 1999, page 6).

Because the hardware implementation of mathematical functions is difficult, most mathematical functions are implemented by software. On the conventional processor, all complex mathematical functions (even most basic mathematical functions) are implemented by software. As software computing is more complicated than hardware computing, calculation of complex mathematical functions is slow and inefficient. It is highly desired to realize hardware computing for complex mathematical functions. It is even more desirable to realize configurable hardware computing, i.e. to use a same set of hardware to implement a large set of complex mathematical functions.

A configurable processor is a semi-custom integrated circuit designed to be configured by a customer after manufacturing. It is also referred to as configurable electrical circuit, configurable gate array, field-programmable gate array (FPGA), complex programmable logic device (CPLD), or other names. U.S. Pat. No. 4,870,302 issued to Freeman on Sep. 26, 1989 (hereinafter referred to as Freeman) discloses a configurable electrical circuit. It contains an array of configurable logic elements (CLE's, also known as configurable logic blocks) and a hierarchy of configurable interconnects (CIT's, also known as programmable interconnects) that allow the configurable logic elements to be wired together per customer's desire. Each CLE in the array is in itself capable of realizing any one of a plurality of logic functions (e.g. shift, logic NOT, logic AND, logic OR, logic NOR, logic NAND, logic XOR, arithmetic addition "+", arithmetic subtraction "−", etc.) depending upon a first configuration signal. Each CIT can selectively couple or de-couple interconnect lines depending upon a second configuration signal.

In the configurable electrical circuit of Freeman, fixed computing elements are used to implement basic mathematical functions. These fixed computing elements are portions of hard blocks which are not configurable, i.e. the circuits implementing these mathematical functions are fixedly connected and are not subject to change by programming. As is the case with the conventional processor, the fixed computing elements can implement only a small number of mathematical functions. This limits further applications of the configurable electrical circuit. To overcome these difficulties, the present invention expands the original concept of Freeman from configurable logic to configurable computing.

Objects and Advantages

It is a principle object of the present invention to implement configurable computing.

It is a further object of the present invention to provide a configurable processor to customize not only logic functions, but also mathematical functions.

It is a further object of the present invention to improve computational complexity.

It is a further object of the present invention to improve computational density.

It is a further object of the present invention to shorten the time-to-market.

It is a further object of the present invention to reduce the physical size of the configurable processor.

It is a further object of the present invention to lower the cost of the configurable processor.

It is a further object of the present invention to provide a paradigm shift for scientific computing.

It is a further object of the present invention to realize rapid and efficient modeling and simulation.

In accordance with these and other objects of the present invention, the present invention discloses a configurable processor.

SUMMARY OF THE INVENTION

The present invention discloses a configurable processor. It comprises at least an array of configurable computing elements (CCE's). Each CCE comprises at least a three-dimensional (3-D) memory (3D-M) array; an arithmetic logic circuit (ALC); and, a plurality of inter-storage-processor (ISP) connections communicatively coupling them. The 3D-M array stores a look-up table (LUT) of a mathematical function, while the ALC performs arithmetic operations on selected data from the LUT.

The preferred configurable processor comprises a semiconductor substrate, which is single-crystalline. The ALC and at least a portion of the peripheral circuit of the 3D-M are disposed on the semiconductor substrate. On the other hand, the memory cells of the 3D-M array are not disposed on the semiconductor substrate. In fact, they are neither in contact with nor interposed therebetween by any semiconductor substrate. Hence, the ALC and the portion of the peripheral circuit of the 3D-M array comprise at least one single-crystalline semiconductor material, while the memory cells of the 3D-M array do not comprises any single-crystalline semiconductor material.

The usage of the CCE includes two stages: a configuration stage and a computing stage. In the configuration stage, the LUT of a desired mathematical function is loaded into the memory cells of the 3D-M array. In the computing stage, selected data of the LUT for the desired mathematical function is read out from the memory cells of the 3D-M array, upon which further computation is performed.

Preferably, the 3D-M array is a 3-D non-volatile memory (3D-NVM) array, which keeps the data stored therein for long term even when power goes off. Depending on the number of programmings that can be performed on the 3D-NVM array, the preferred configurable processor can be categorized into one-time-configurable processor and re-configurable processor. By using a 3-D one-time-programmable memory (3D-OTP) array, the LUT can be loaded once. This type of the configurable processor is referred to as one-time-configurable processor. On the other hand, by using a 3-D multiple-time-programmable memory (3D-MTP, or 3-D rewritable memory) array, the LUT can be loaded multiple times. Accordingly, the CCE is a re-configurable computing element (re-CCE) and this type of the configurable processor is referred to as re-configurable processor.

Besides CCE's, the preferred configurable processor further comprises at least an array of configurable logic elements (CLE's) and/or at least an array of configurable interconnects (CIT's). With CLE's and CIT's, the preferred configurable processor can be used to implement complex mathematical functions. A complex mathematical function is first decomposed into a combination of basic mathematical functions. Each basic mathematical function is realized by programming an associated CCE. The complex mathematical function is then realized by programming the appropriate CLE's and CIT's.

The present invention realizes hardware computing of complex mathematical functions. Compared with software computing, hardware computing is much faster and more efficient. Because the LUT's are used as a primary means to implement mathematical functions, this type of computing is referred to as memory-based computing (MBC). Although arithmetic operations are still performed, using a larger LUT as a starting point, the MBC only needs to calculate a polynomial to a smaller order. For the MBC, the fraction of computation done by the LUT is significantly more than the ALC.

The advantage of MBC over logic-based computing (LBC) is configurability and generality. Because the LUT's of different mathematical functions can be loaded into the 3D-M array, the preferred configurable processor can be configured into implementing different mathematical functions. In addition, with hundreds of gigabits to store the LUT's (a 3D-XPoint die stores 128 Gb), the types of the mathematical functions that can be implemented by the preferred configurable processor are essentially boundless.

The preferred configurable processor 100 takes two forms—singlet and doublet. In a preferred configurable-processor singlet, the 3D-M array and the ALC are monolithically integrated into a single configurable-processor die. On the other hand, in a preferred configurable-processor doublet, the 3D-M array and the ALC are disposed onto two separate dice—a 3D-M die and a processing die bonded face-to-face.

For either configurable-processor die or configurable-processor doublet, the 3D-M array and the ALC substantially overlap. In addition, because they do not penetrate through any semiconductor substrate, the ISP-connections are short, small and numerous. Adding the fact that the 3D-NVM cells are much smaller than the RAM cells (4 $F^2$ vs. ~100 $F^2$, F is minimum feature size), the preferred CCE is much smaller than prior art. Hence, the preferred configurable processor contains massive number of the CCE's. In one preferred embodiment, the preferred configurable processor contains at least one thousand CCE's. In another preferred embodiment, the preferred configurable processor contains at least ten thousand CCE's. As a result, the preferred configurable processor is computationally powerful, i.e. it can achieve massive parallelism, great computational complexity, and/or large computational density.

Accordingly, the present invention discloses a configurable processor, comprising a single-crystalline semiconductor substrate and an array of configurable computing elements (CCE's), each of said CCE's comprising: at least a three-dimensional memory (3D-M) array including memory cells for storing at least a portion of a look-up table (LUT) of a mathematical function, wherein said memory cells are neither in contact with nor interposed therebetween by any semiconductor substrate including said single-crystalline semiconductor substrate; and, said memory cells do not comprise any single-crystalline semiconductor material; an arithmetic logic circuit (ALC) and at least a portion of a peripheral circuit of said 3D-M array disposed on said single-crystalline semiconductor substrate, wherein said ALC performs at least one arithmetic operation on selected data of said LUT; said ALC and said portion of said peripheral circuit are communicatively coupled; and, said ALC and said portion of said peripheral circuit comprise at least a single-crystalline semiconductor material; a plurality of inter-storage-processor (ISP) connections for communicatively coupling said memory cells and said portion of said peripheral circuit, wherein said ISP-connections do not penetrate through any semiconductor substrate including said single-crystalline semiconductor substrate; and, said memory cells and said ALC at least partially overlap.

BRIEF DESCRIPTION OF THE DRAWINGS

FIG. 7 is a circuit block diagram of a first preferred configurable processor;

FIG. 8 shows an instantiation of the first preferred configurable processor;

Figure 1:
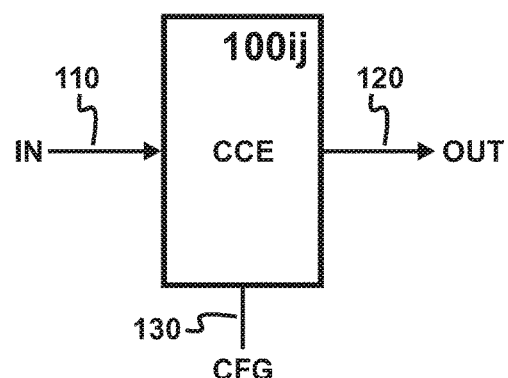
FIG. 1 discloses a symbol representing configurable computing element (CCE)

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments. Singular form is used to refer to both singular and plural forms. The symbol "/" means a relationship of "and" or "or". The terms "singlet" and "die" are used interchangeably. Furthermore, the terms "program" and "write" are used interchangeably.

As used herein, the term "mathematical functions" refer to non-arithmetic mathematical functions, i.e. the mathematical functions that cannot be expressed in terms of a finite number of arithmetic operations. In other words, the mathematical functions involve more operations than arithmetic operations performable by the arithmetic logic circuit (ALC). The term "memory" is used to mean a semiconductor memory and the term "memory array" is used in its broadest sense to mean a collection of all memory cells sharing at least one address line. The term "look-up table (LUT)" could refer to either look-up table per se, or the memory circuit used to store the look-up table, depending on the context. The phrase "communicatively coupled" is used in its broadest sense to mean any coupling whereby electrical signals may be passed from one element to another element.

As used herein, the phrase "a circuit on a substrate" is used in its broadest sense to mean that at least some of its active elements (e.g. transistors) or portions thereof (e.g. channel of the MOSFET) are formed in the substrate, even though the interconnects coupling the active elements (e.g. transistors) and other portions of the active elements are formed above the substrate. The phrase "a circuit above a substrate" is used in its broadest sense to mean that all active elements are disposed above the substrate and they are not in contact with the substrate. The phrase "memory cells are interposed therebetween by a semiconductor substrate" means that a semiconductor substrate separates the memory cells; in other words, there is a semiconductor substrate between the memory cells. The phrase "memory cells are not interposed therebetween by any semiconductor substrate" means that no semiconductor substrate separates the memory cells; in other words, there is no semiconductor substrate between the memory cells.

As used herein, the phrases "a circuit made of single-crystalline semiconductor material" and "a circuit comprising at least a single-crystalline semiconductor material" mean that at least a key portion (e.g. channel) of the active elements (e.g. transistors) is formed in a single-crystalline semiconductor substrate (or, film). The phrases "a circuit made of non-single-crystalline semiconductor material", "a circuit comprising non-single-crystalline semiconductor materials" and "a circuit does not comprise any single-crystalline semiconductor material" mean that all key portions (e.g. channel/gate/source/drain) of the active elements (e.g. transistors) are formed in a non-single-crystalline (e.g. poly-crystalline, micro-crystalline or amorphous) semiconductor film and does not comprise any single-crystalline semiconductor material.

As used herein, the phrases "diode", "steering element", "steering device", "selector", "selecting element", "selecting device", "selection element" and "selection device", all have the same meaning. They are used in their broadest sense to mean a diode-like device whose resistance at the read voltage is substantially lower than that when the applied voltage has a magnitude smaller than or a polarity opposite to that of the read voltage.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

Figure 2:
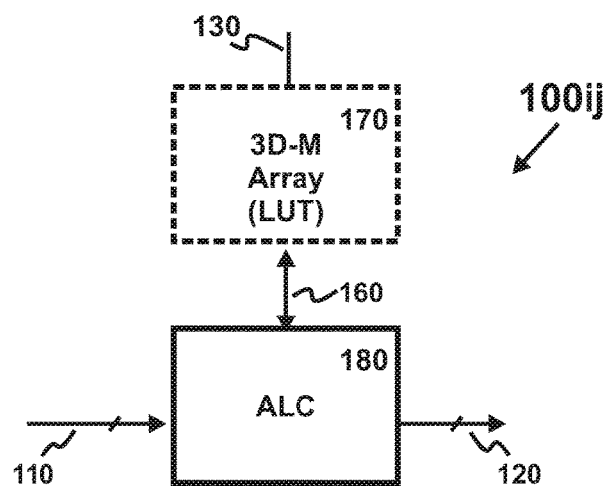
FIG. 2 is a circuit block diagram of a preferred CCE.

Referring now to FIGS. 1-2, a preferred configurable computing element (CCE) 100$ij$ is disclosed. FIG. 1 shows its symbol. The input port IN includes input data 110, the output port OUT includes output data 120, and the configuration port CFG includes at least a configuration signal 130. When the configuration signal 130 is "write", the look-up table (LUT) for a desired mathematical function is loaded into the CCE 100$ij$; when the configuration signal 130 is "read", selected data of the LUT is read out from the CCE 100$ij$.

FIG. 2 shows its circuit block diagram. The CCE 100$ij$ comprises a three-dimensional (3-D) memory (3D-M) array 170, an arithmetic logic circuit (ALC) 180, and a plurality of inter-storage-processor (ISP) connections communicatively coupling them. The 3D-M array 170 stores a look-up table (LUT) of a mathematical function, while the ALC 180 performs arithmetic operations on selected data from the LUT.

Figures 3A, 3B, 3C:
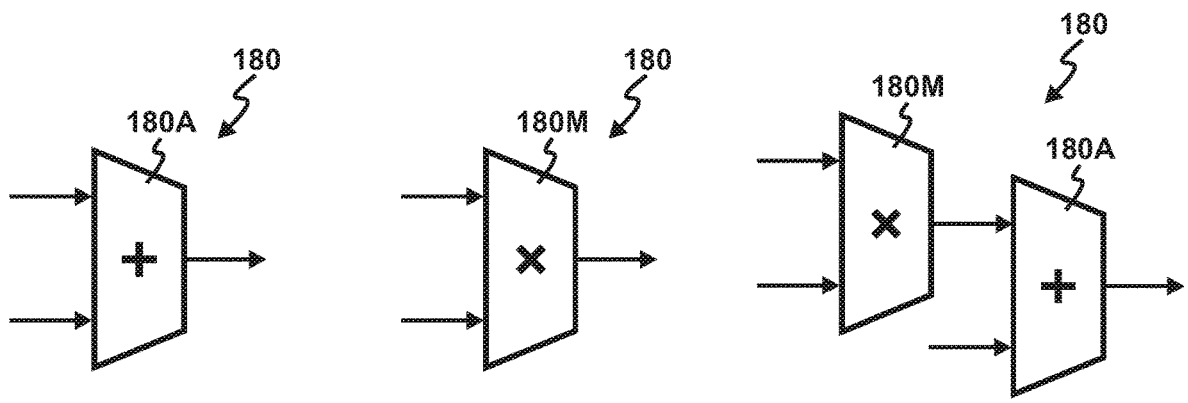
FIGS. 3A-3C disclose three preferred arithmetic logic circuits (ALC's)

Referring now to FIGS. 3A-3C, three preferred ALC's 180 are disclosed. The first preferred ALC 180 comprises an adder 180A, the second preferred ALC 180 comprises a multiplier 180M, with the third preferred ALC 180 comprising a multiply-accumulator (MAC), which includes an adder 180A and a multiplier 180M. The preferred ALC 180 could perform integer arithmetic operations, fixed-point arithmetic operations, or floating-point arithmetic operations.

Figure 4A:
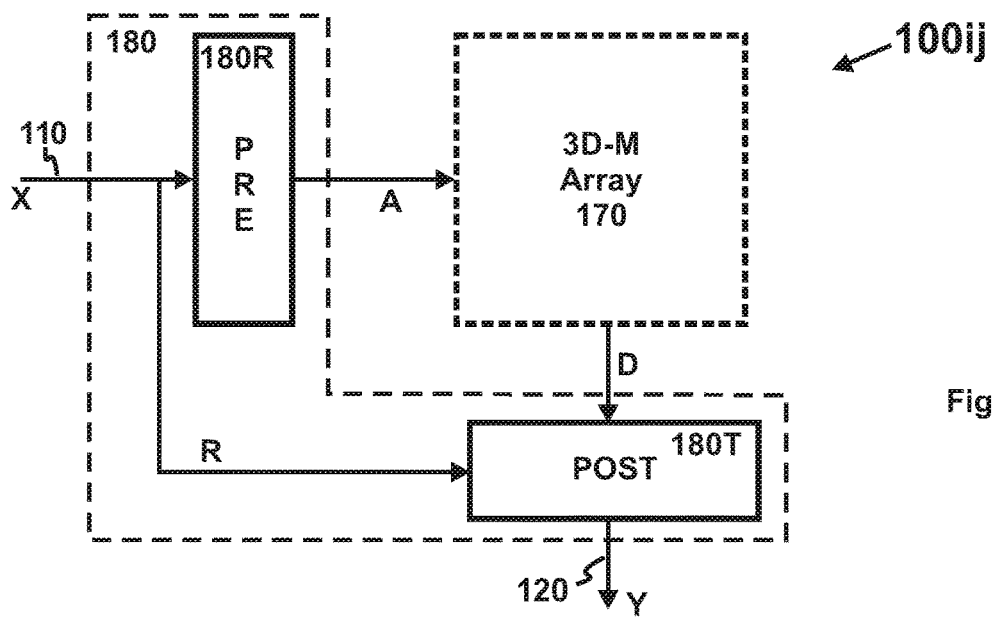
FIGS. 4A-4B disclose two instantiations of the preferred CCE for implementing a basic mathematical function Y=f (X)
Figure 4B:
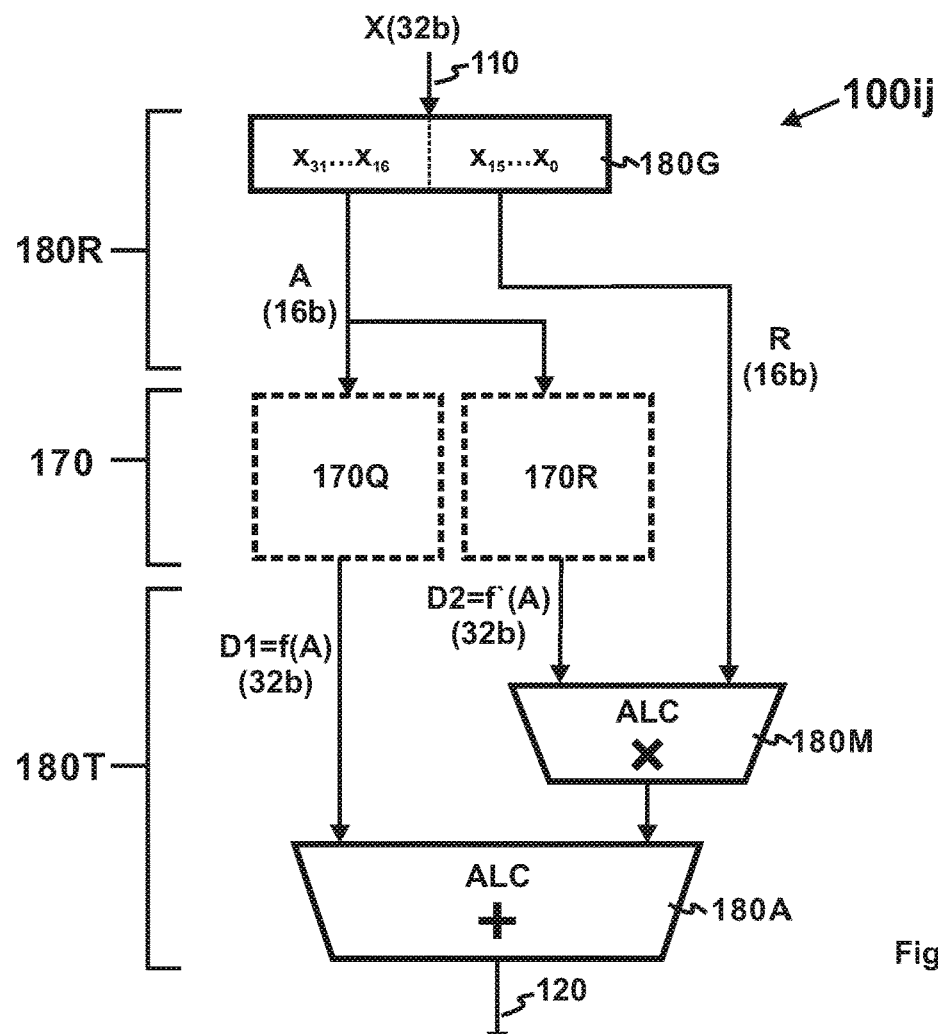

Referring now to FIGS. 4A-4B, two instantiations of the preferred CCE 100$ij$ for implementing a basic mathematical function Y=f(X) are disclosed. In the first instantiation of FIG. 4A, the preferred CCE 100$ij$ comprises a pre-processing circuit 180R and a post-processing circuit 180T. The pre-processing circuit 180R converts the input variable (X) 110 into an address (A) of the 3D-M array 170. After the data (D) at the address (A) are read out from the 3D-M array 170, the post-processing circuit 180T converts them into the functional value (Y) 120. A residue (R) of the input variable (X) is fed into the post-processing circuit 180T to improve the calculation precision.

The circuit implementation of mathematical functions is much more complicated than the circuit implementation of logic functions. The LUT stored in the CCE 100$ij$ includes numerical values related to a mathematical function, whereas the LUT stored in a configurable logic element (CLE) of the configurable electrical circuit (Freeman) includes only logic values of a logic function. Numerical values are denoted by a large number of bits. For example, a half-precision floating-point number comprises 16 bits; a single-precision floating-point number comprises 32 bits; a double-precision floating-point number comprises 64 bits. In comparison, the logic values can be denoted by a single bit and have only two values, i.e. "true" and "false". Accordingly, the LUT size in the CCE 100*ij* is substantially larger than that in the CLE.

In an LUT for a mathematical function, the numerical values include the functional values of the mathematical function. When the input variable of a mathematical function comprises a larger number of bits, the LUT size could become excessively large. For example, an LUT including the functional values of a single-precision mathematical function (32-bit input and 32-bit output) needs 2³²*32=128 Gb. To reduce the LUT size, Taylor-series (or other polynomial expansion) calculation is preferably used. To be more specific, the LUT not only includes the functional values, but also includes the derivative values of a mathematical function, e.g. the first-order derivative values, the second-order derivative values, and so on. To perform the Taylor-series calculation, the CCE 100*ij* further comprises at least an adder and a multiplier.

FIG. 4B discloses a second instantiation of the preferred CCE 100*ij*. It realizes a single-precision mathematical function $Y=f(X)$ using first-order Taylor series. The input variable X110 has 32 bits ($x_{31} \ldots x_0$). The pre-processing circuit 180R extracts the higher 16 bits ($x_{31} \ldots x_{16}$) thereof and sends it as a 16-bit address A to the 3D-M array 170. The pre-processing circuit 180R further extracts the lower 16 bits ($x_{15} \ldots x_0$) and sends it as a 16-bit residue R to the post-processing circuit 180T. The 3D-M array 170 stores two LUT's 170Q, 170R. With each having 16-bit input and 32-bit output, both LUT's 170Q, 170R have 2 Mb capacities. The LUT 170Q stores the functional value D1=f(A), while the LUT 170R stores the first-order derivative value D2=f'(A). The post-processing circuit 180T comprises a multiplier 180M and an adder 180A. The output value (Y) 120 has 32 bits and is calculated from polynomial interpolation. In this case, the polynomial interpolation is a first-order Taylor series: $Y(X)=D1+D2*R=f(A)+f'(A)*R$. To those skilled in the art, higher-order polynomial interpolation (e.g. higher-order Taylor series) can be used to improve the calculation precision.

By combining the LUT with polynomial interpolation, a high precision can be achieved without using an excessively large LUT. In the above embodiment, a single-precision function can be realized using a total of 4 Mb LUT (2 Mb for the functional values, and 2 Mb for the first-order derivative values) in conjunction with a first-order Taylor series calculation. This is significantly less than the LUT-only approach (4 Mb vs. 128 Gb).

Besides elementary functions (including algebraic functions and transcendental functions), the preferred CCE 100*ij* can be used to implement non-elementary functions such as special functions. Special functions can be defined by means of power series, generating functions, infinite products, repeated differentiation, integral representation, differential difference, integral, and functional equations, trigonometric series, or other series in orthogonal functions. Important examples of special functions are gamma function, beta function, hyper-geometric functions, confluent hyper-geometric functions, Bessel functions, Legendre functions, parabolic cylinder functions, integral sine, integral cosine, incomplete gamma function, incomplete beta function, probability integrals, various classes of orthogonal polynomials, elliptic functions, elliptic integrals, Lame functions, Mathieu functions, Riemann zeta function, automorphic functions, and others. Direct hardware implementations of special functions using the CCE 100*ij* will simplify computing and promote their applications in scientific computing.

Preferably, the 3D-M array is a 3-D non-volatile memory (3D-NVM) array, which keeps the data stored therein for long term even when power goes off. Depending on the number of programmings that can be performed on the 3D-NVM array, the preferred configurable processor 100 can be categorized into one-time-configurable processor and re-configurable processor. By using a 3-D one-time-programmable memory (3D-OTP) array, the LUT can be loaded once. This type of the configurable processor is referred to as one-time-configurable processor. On the other hand, by using a 3-D multiple-time-programmable memory (3D-MTP, or 3-D rewritable memory) array, the LUT can be loaded multiple times. Accordingly, the CCE is a re-configurable computing element (re-CCE) and this type of the configurable processor is referred to as re-configurable processor.

Figure 5:
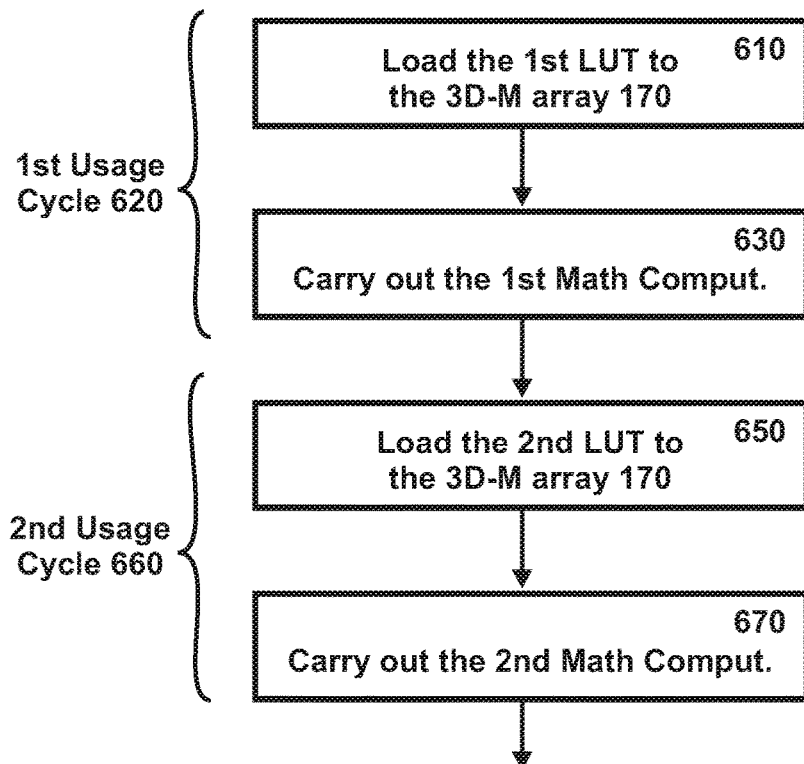
FIG. 5 discloses two usage cycles of a preferred re-configurable computing element (re-CCE)

Referring now to FIG. 5, two usage cycles—a first usage cycle 620 and second usage cycle 660 of a preferred re-configurable computing element (re-CCE) 100*ij* are shown. The first usage cycle 620 includes two stages: a first configuration stage 610 and a first computing stage 630. In the first configuration stage 610, a first LUT of a first mathematical function is loaded into the 3D-M array 170. In the first computing stage 630, selected data from the first LUT are read out from the 3D-M array 170, which are utilized to calculate the first mathematical function.

Being reconfigurable, the re-CCE 100*ij* can realize a second mathematical function during the second usage cycle 660, which includes a second configuration stage 650 and a second computing stage 670. During the second usage cycle 660, the first LUT is erased from the 3D-M array 170 first. Then a second LUT of a second mathematical function is loaded into the 3D-M array 170 during the second configuration stage 650. Later selected data from the second LUT are read out to calculate the second mathematical function during the second computing stage 670. The re-CCE 100*ij* is particularly suitable for single-instruction-multiple-data (SIMD)-type of data processing. Once the LUT's of the mathematical functions (considered as part of the instruction) are loaded into the 3D-M arrays 170 in the configuration stage, a large amount of data can be fed into the re-CCE 100*ij* and processed at high speed. SIMD has many applications, e.g. vector processing in image processing, massively parallel processing in scientific computing.

Figure 6A:
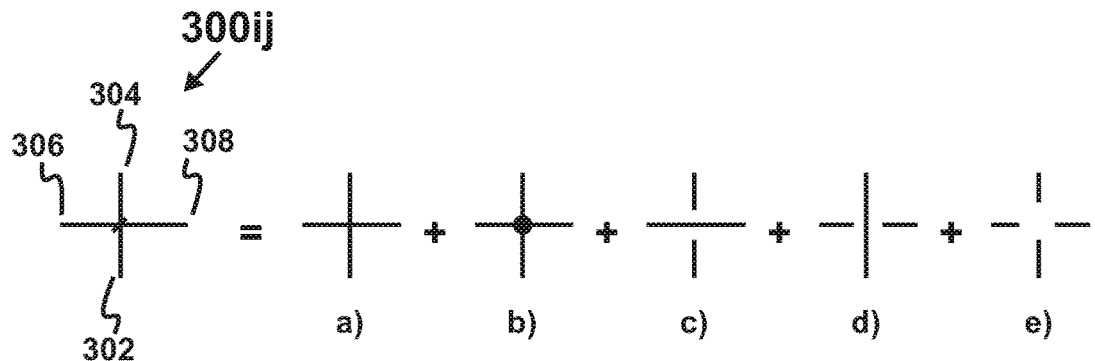
FIG. 6A shows an interconnect library supported by a preferred configurable interconnect (CIT)
Figure 6B:
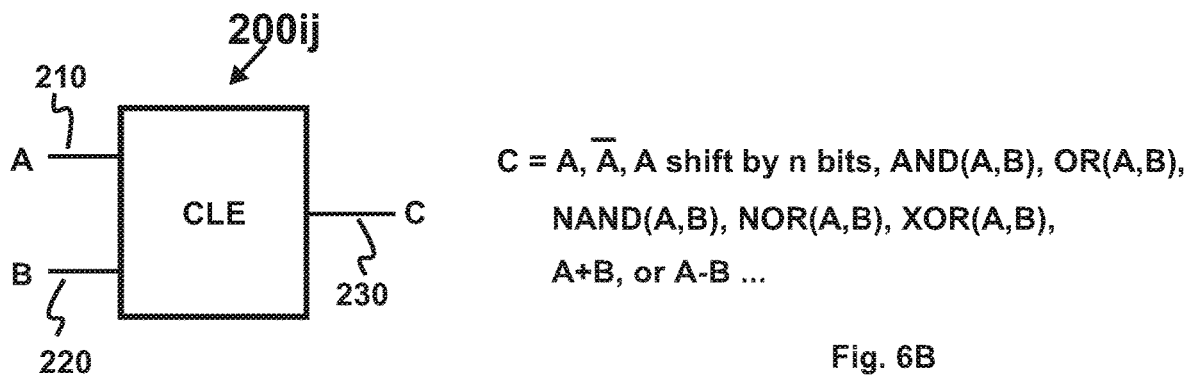
FIG. 6B shows a logic library supported by a preferred configurable logic element (CLE)

Referring now to FIGS. 6A-6B, an interconnect library and a logic library are shown. FIG. 6A shows an interconnect library supported by a preferred configurable interconnect (CIT) 300. An interconnect library is a collection of all interconnects supported by a CIT. This interconnect library includes the followings: a) the interconnects 302/304 are coupled, the interconnects 306/308 are coupled, but 302/304 are not connected with 306/308; b) the interconnects 302/304/306/308 are all coupled; c) the interconnects 306/308 are coupled, but the interconnects 302, 304 are not coupled, neither are 302, 304 connected with 306/308; d) the interconnects 302/304 are coupled, but the interconnects 306, 308 are not coupled, neither are 306, 308 connected with 302/304; e) interconnects 302, 304, 306, 308 are not coupled at all. As used herein, the symbol "/" between two interconnects means that these two interconnects are coupled, while the symbol "," between two interconnects means that these two interconnects are not coupled. More details on the CIT's are disclosed in Freeman.

FIG. 6B shows a logic library supported by a preferred configurable logic element (CLE) 200. A logic library is a collection of all logic functions supported by a CLE. In this preferred embodiment, the inputs A and B include input data 210, 220, and the output C includes the output data 230. The logic library includes the following logic functions: C=A, NOT A, A shift by n bits, AND(A,B), OR(A,B), NAND(A,B), NOR(A,B), XOR(A,B), A+B, A−B. To facilitate pipelining, the CLE 200 may comprise sequential logic such as flip-flops and registers. More details on the CLE's are disclosed in Freeman.

Referring now to FIGS. 7-8, a first preferred configurable processor 100 is disclosed. It can be configured to implement various complex mathematical functions. FIG. 7 is its circuit block diagram. The first preferred configurable processor 100 comprises first and second configurable slices 400A, 400B. Each configurable slice (e.g. 400A) comprises a first array of CCE's (e.g. 100AA-100AD) and a second array of CLE's (e.g. 200AA-200AD). A configurable channel 320 is placed between the first array of CCE's (e.g. 100AA-100AD) and the second array of CLE's (e.g. 200AA-200AD). The configurable channels 310, 330, 350 are also placed between different configurable slices 400A, 400B. Each configurable channel (e.g. 310) comprises an array of CIT's 300. For those skilled in the art, besides configurable channels, the sea-of-gates or other architecture may also be used.

FIG. 8 is an instantiation of the first preferred configurable processor 100. It is configured to implement a complex mathematical function e=a·sin(b)+c·cos(d). The symbol inside each CCE 100$ij$ denotes the mathematical function the CCE 100$ij$ is configured into. The symbol inside each CLE 200 denotes the logic function the CLE 200 is configured into. The CIT's 300 in the configurable channel 310-350 use the same convention as FIG. 6A: the interconnects with dots mean that the interconnects are connected; the interconnects without dots mean that the interconnects are not connected; a broken interconnect means that two broken sections are disconnected.

For this instantiation, the configurable channel 310 is configured in such a way that the inputs a, b, c, d associated with four independent variables of the complex mathematical function e=a·sin(b)+c·cos(d) are coupled to the inputs of the CCE's 100AA-100AD, respectively. Furthermore, the CCE 100AA is configured to realize the function log( ), whose result log(a) is sent to a first input of the CLE 200A. The CCE 100AB is configured to realize the function log[sin( )], whose result log[sin(b)] is sent to a second input of the CLE 200A. The CLE 200A is configured to realize arithmetic addition "+", whose result log(a)+log[sin(b)] is sent the CCE 100BA. The CCE 100BA is configured to realize the function exp( ), whose result exp{log(a)+log[sin(b)]}=a·sin(b) is sent to a first input of the CLE 200BA. Similarly, through proper configurations, the results of the CCE's 100AC, 100AD, the CLE's 200AC, and the CCE 100BC can be sent to a second input of the CLE 200BA. The CLE 200BA is configured to realize arithmetic addition "+", whose result a·sin(b)+c·cos(d) is sent to the output e. Apparently, by changing its configuration, the first preferred configurable processor 100 can realize other complex mathematical functions.

Figure 9:
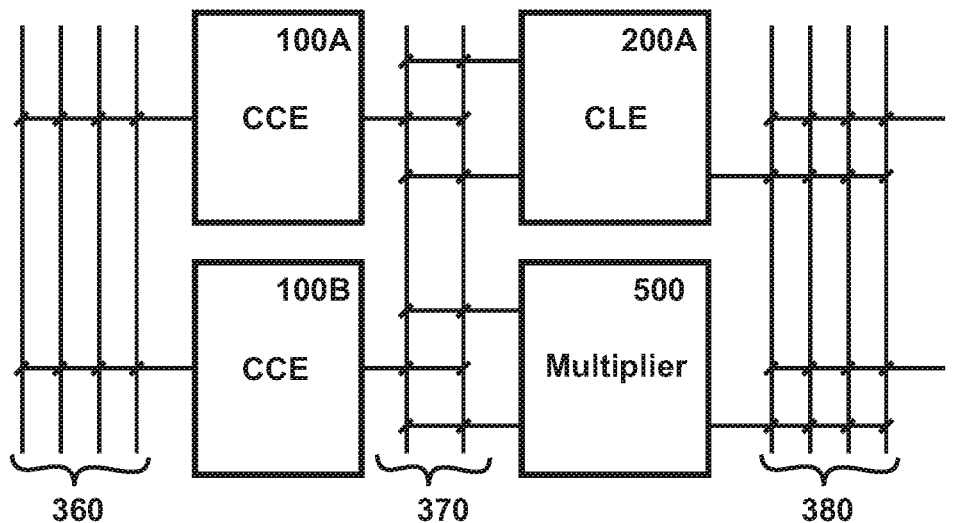
FIG. 9 is a circuit block diagram of a second preferred configurable processor.

Referring now to FIGS. 9-100B, a second preferred configurable processor 100 is shown. FIG. 9 is its circuit block diagram. Besides CCE's 100A, 100B and CLE 200A, this preferred embodiment further comprises a multiplier 500, which is disposed on the semiconductor substrate. The configurable channels 360-380 comprise a plurality of CIT's. With the addition of the multiplier 500, the preferred configurable processor 100 can realize more mathematical functions and its computational power becomes more powerful.

Figure 10A:
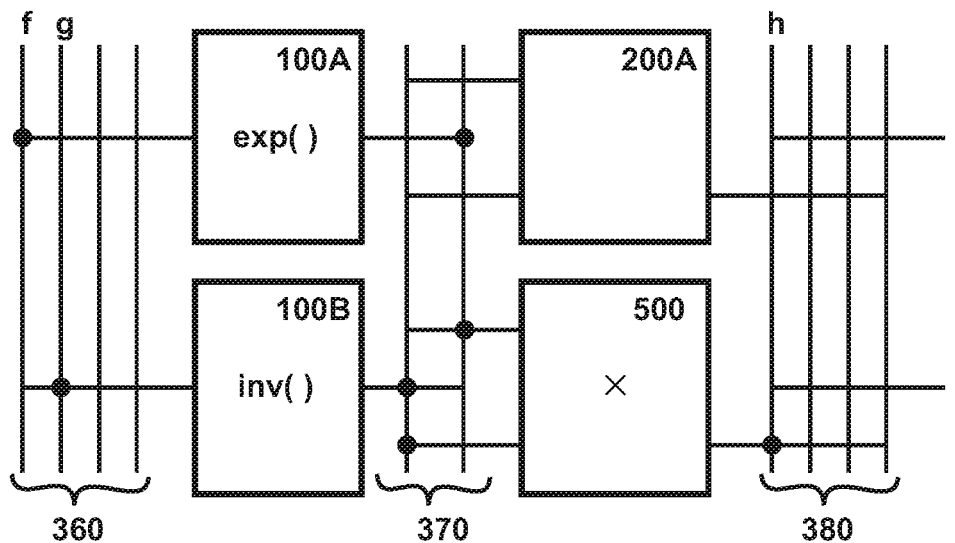
FIGS. 10A-10B show two instantiations of the second preferred configurable processor.
Figure 10B:
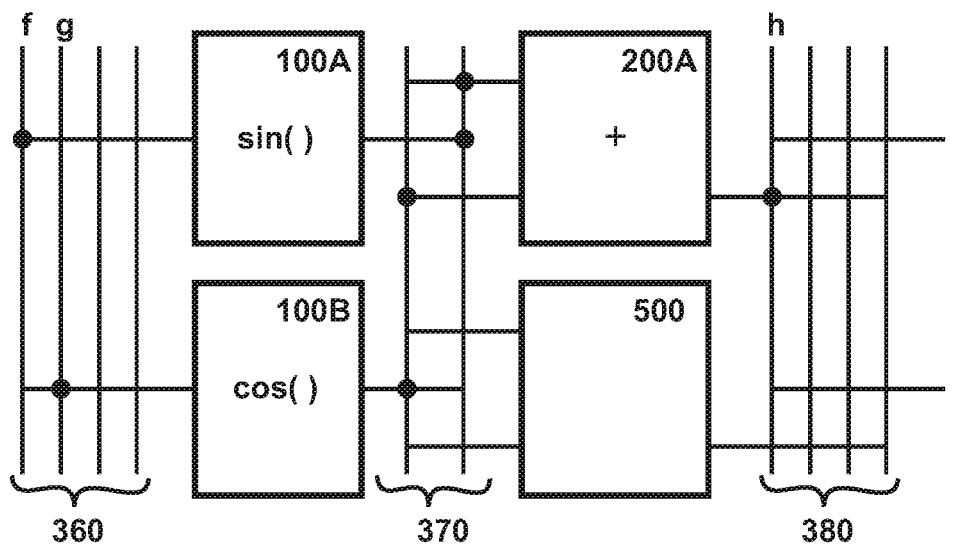

FIGS. 10A-10B disclose two instantiations of the second preferred configurable processor 100. In the instantiation of FIG. 10A, the CCE 100A is configured to realize the function exp( ), while the CCE 100B is configured to realize the function inv( ). The configurable channel 370 is configured in such a way that the outputs of 100A, 100B are fed into the multiplier 500. The final output is then h=exp(f)*inv(g). On the other hand, in the instantiation of FIG. 10B, the CCE 100A is configured to realize the function sin( ), while the CCE 100B is configured to realize the function cos( ). The configurable channel 370 is configured in such a way that the outputs of 100A, 100B are fed into the CLE 200A, which is configured to realize arithmetic addition. The final output is then h=sin(f)+cos(g).

FIGS. 11A-13D disclose two forms of the preferred configurable processor 100. The first form is a configurable-processor singlet 100 (FIGS. 11A-12), where the 3D-M array 170 and the ALC 180 are monolithically integrated into a single configurable-processor die 100. The second form is a configurable-processor doublet 100 (FIGS. 13A-13D), where the 3D-M array 170 and the ALC 180 are disposed onto two separate dice—a 3D-M die 100$a$ and a processing die 100$b$ bonded face-to-face. In both cases, since no semiconductor substrate separates the 3D-M array 170 and the ALC 180, the ISP-connections 160 do not penetrate through any semiconductor substrate.

Figure 11A:
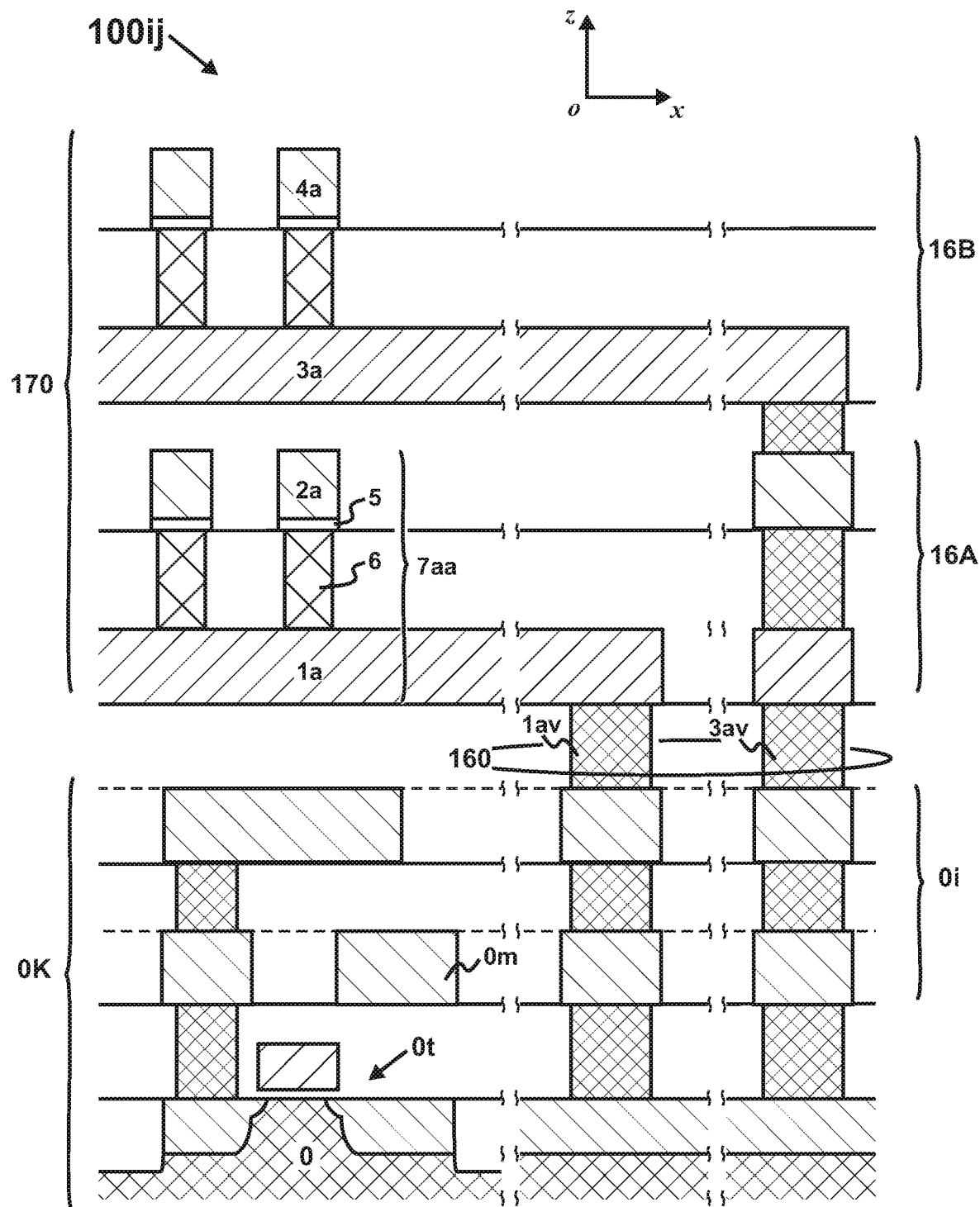
FIGS. 11A-11C are cross-sectional views of three preferred CCE's in three preferred configurable-processor singlets (i.e. dice)
Figure 11B:
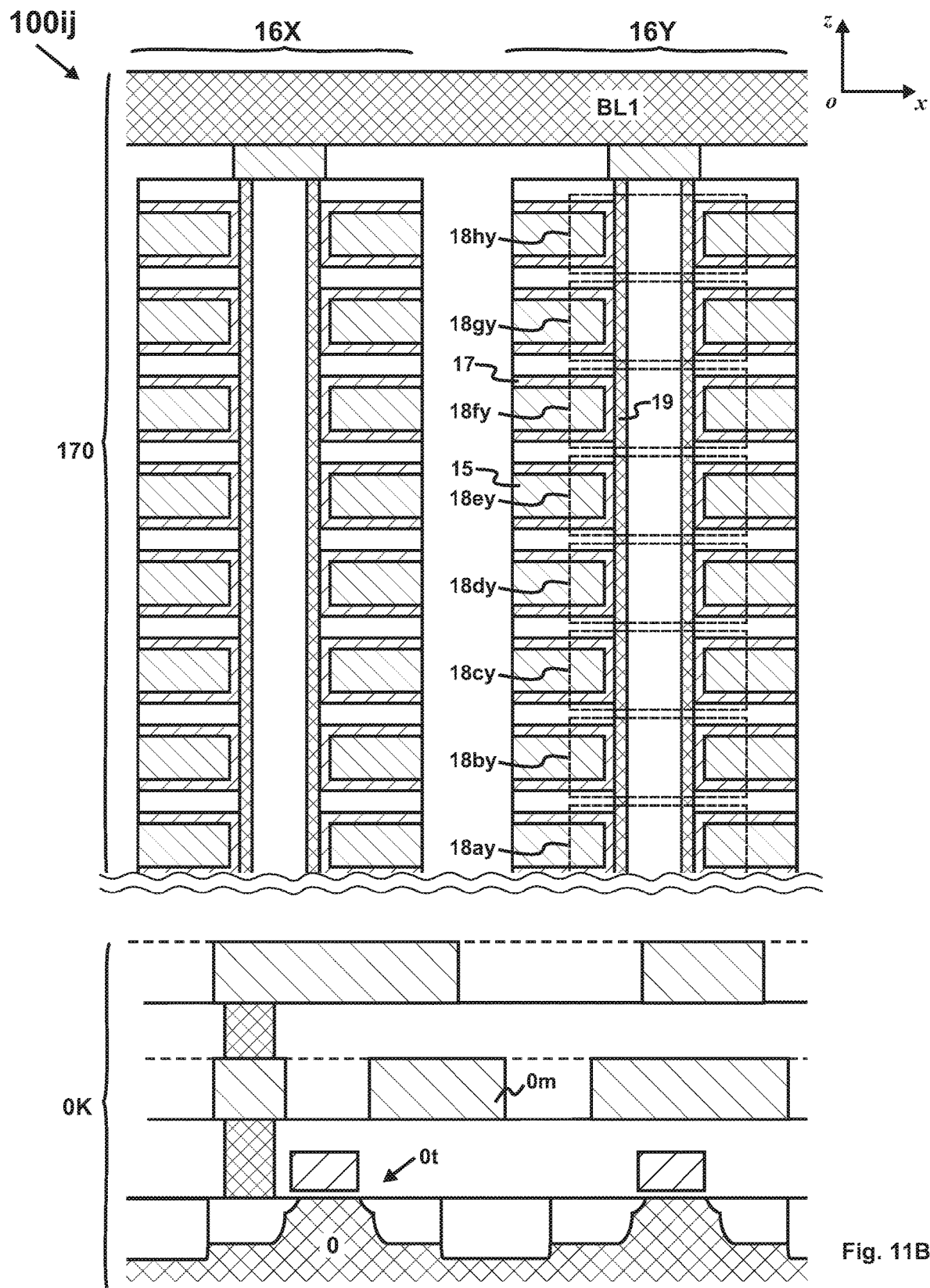
Figure 11C:
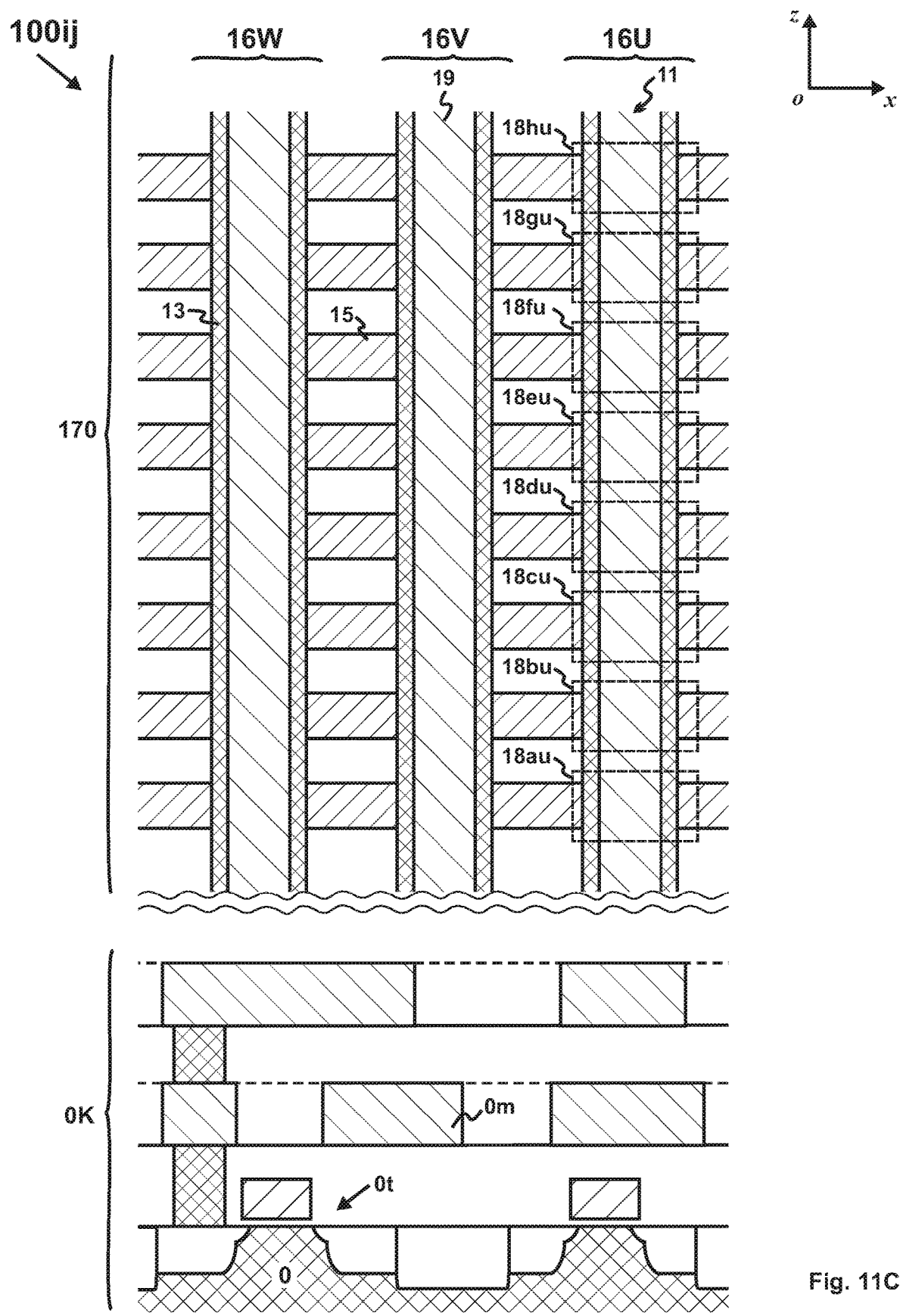

Referring now to FIGS. 11A-11C, three preferred CCE's 100$ij$ of the preferred configurable-processor die 100 are disclosed. For these preferred embodiments, the 3D-M array 170 and the ALC 180 are monolithically integrated into a single configurable-processor die 100. The ALC 180 is formed on a semiconductor substrate 0; the memory cells of the 3D-M array 170 are vertically stacked on the ALC 180; and, the ALC 180 and the 3D-M array 170 are communicatively coupled by a plurality of ISP-connections. It should be noted that, besides the ALC 180, the CLE 200 and, in some preferred embodiments, at least a portion of the CIT 300, are also formed on the semiconductor substrate 0.

The preferred configurable-processor die 100 comprises only a single semiconductor substrate 0. Since the semiconductor substrate 0 is single-crystalline, the ALC's 180 comprise at least a single-crystalline semiconductor material. On the other hand, since that they are neither in contact with nor interposed therebetween by any semiconductor substrate, the memory cells of the 3D-M arrays 170 do not comprise any single-crystalline semiconductor material.

The 3D-M arrays 170 are preferably 3-D non-volatile memory (3D-NVM) arrays, which keeps the data stored therein for long term even when power goes off. Compared with a volatile memory (e.g. SRAM, DRAM), the memory cell of a 3D-NVM is much smaller. For example, the cell size of a three-dimensional read-only memory (3D-ROM, referring to U.S. Pat. No. 5,385,396) is only 4 $F^2$, whereas the cell size of an SRAM is ~100 $F^2$ (F is the minimum feature size).

Based on its physical structure, the 3D-M can be categorized into horizontal 3D-M (3D-$M_H$) and vertical 3D-M (3D-$M_V$). In a 3D-$M_H$, all address lines are horizontal. The memory cells form a plurality of horizontal memory levels which are vertically stacked above each other. A well-known 3D-$M_H$ is 3D-XPoint. In a 3D-$M_V$, at least one set of the address lines are vertical. The memory cells form a plurality of vertical memory strings which are placed side-by-side on/above the substrate. A well-known 3D-$M_V$ is 3D-NAND. In general, the 3D-$M_H$ (e.g. 3D-XPoint) is faster, while the 3D-$M_V$ (e.g. 3D-NAND) is denser.

In the present invention, the 3D-NVM array 170 is preferably a 3-D writable memory (3D-W), whose memory cells are electrically programmable. Based on the number of programmings allowed, the 3D-W can be further categorized into three-dimensional one-time-programmable memory (3D-OTP) and three-dimensional multiple-time-programmable memory (3D-MTP, including rewritable). Common 3D-MTP includes 3D-XPoint and 3D-NAND. Other 3D-MTP's include memristor, resistive random-access memory (RRAM or ReRAM), phase-change memory (PCM), programmable metallization cell (PMC) memory, conductive-bridging random-access memory (CBRAM), and the like.

In FIG. 11A, the preferred configurable processor 100 comprises a substrate circuit 0K and a 3D-$M_H$ array 170 vertically stacked thereon. The substrate circuit 0K includes at least a portion of a peripheral circuit of the 3D-$M_H$ array 170, ALC 180, CLE 200, and/or CIT 300. It comprises transistors 0t and metal lines 0m. The transistors 0t are disposed on a single-crystalline semiconductor substrate 0. The metal lines 0m form substrate interconnects 0i, which communicatively couple the transistors 0t. The 3D-$M_H$ array 170 includes two memory levels 16A, 16B, with the memory level 16A stacked on the substrate circuit 0K and the memory level 16B stacked on the memory level 16A. Memory cells (e.g. 7aa) are formed at the intersections between two address lines (e.g. 1a, 2a).

The memory levels 16A, 16B are communicatively coupled with the substrate circuit 0K through contact vias 1av, 3av, which collectively form the ISP-connections 160. The contact vias 1av, 3av comprise a plurality of vias, each of which is communicatively coupled with the vias above or below. Not penetrating through any semiconductor substrate including the single-crystalline semiconductor substrate 0, the ISP-connections 160 are short, small and numerous.

The 3D-$M_H$ array 170 in FIG. 11A is a 3D-W array. Its memory cell 7aa comprises a programmable layer 5 and a diode layer 6. The programmable layer 5 could be an antifuse layer, which can be programmed once and used for the 3D-OTP. Alternatively, the programmable layer 5 could be a resistive RAM (RRAM) layer or phase-change material (PCM) layer (which can be rewritable and used for the 3D-MTP). The diode (also known as selector or other names) layer 6 is broadly interpreted as a layer whose resistance at the read voltage is substantially lower than that when the applied voltage has a magnitude smaller than or polarity opposite to that of the read voltage.

In FIGS. 11B-11C, the preferred configurable processor 100 comprises a substrate circuit 0K and a plurality of 3D-$M_V$ arrays 170 vertically stacked thereon. The substrate circuit 0K is similar to those in FIG. 11A. The 3D-$M_V$ array 170 comprises a plurality of vertically stacked horizontal address lines 15. The 3D-$M_V$ array 170 also comprises a set of vertical address lines, which are perpendicular to the surface of the substrate 0. The 3D-$M_V$ has the largest storage density among semiconductor memories. For reason of simplicity, the ISP-connections (e.g. contact vias) 160 between the 3D-$M_V$ arrays 170 and the substrate circuit 0K are not shown. They are similar to those in the 3D-$M_H$ arrays 170 and well known to those skilled in the art.

The preferred 3D-$M_V$ array 170 in FIG. 11B is based on transistors or transistor-like devices. It comprises a plurality of vertical memory strings 16X, 16Y placed side-by-side. Each memory string (e.g. 16Y) comprises a plurality of vertically stacked memory cells (e.g. 18ay-18hy). Each memory cell (e.g. 18fy) comprises a vertical transistor, which includes a gate (acts as a horizontal address line) 15, a storage layer 17, and a vertical channel (acts as a vertical address line) 19. The storage layer 17 could comprise oxide-nitride-oxide layers, oxide-poly silicon-oxide layers, or the like. This preferred 3D-$M_V$ array 170 is a 3D-NAND and its manufacturing details are well known to those skilled in the art.

The preferred 3D-$M_V$ array 170 in FIG. 11C is based on diodes or diode-like devices. In this preferred embodiment, the 3D-$M_V$ array comprises a plurality of vertical memory strings 16U-16W placed side-by-side. Each memory string (e.g. 16U) comprises a plurality of vertically stacked memory cells (e.g. 18au-18hu). The 3D-$M_V$ array 170 comprises a plurality of horizontal address lines (e.g. word lines) 15 which are vertically stacked above each other. After etching through the horizontal address lines 15 to form a plurality of vertical memory wells 11, the sidewalls of the memory wells 11 are covered with a programmable layer 13. The memory wells 11 are then filled with a conductive materials to form vertical address lines (e.g. bit lines) 19. The conductive materials could comprise metallic materials or doped semiconductor materials. The memory cells 18au-18hu are formed at the intersections of the word lines 15 and the bit line 19. Similar to that in FIG. 11A, the programmable layer 13 could be one-time-programmable (OTP, e.g. an antifuse layer) or multiple-time-programmable (MTP, e.g. an RRAM layer).

To minimize interference between memory cells, a diode or a diode-like device is preferably formed between the word line 15 and the bit line 19. In a first preferred embodiment, the programmable layer 13 acts as a diode. In a second preferred embodiment, this diode is formed by depositing an extra diode layer on the sidewall of the memory well (not shown in this figure). In a third preferred embodiment, this diode is formed naturally between the word line 15 and the bit line 19, i.e. to form a built-in junction (e.g. P-N junction, or Schottky junction). More details on the built-in diode are disclosed in U.S. patent application Ser. No. 16/137,512, filed on Sep. 20, 2018.

Figure 12:
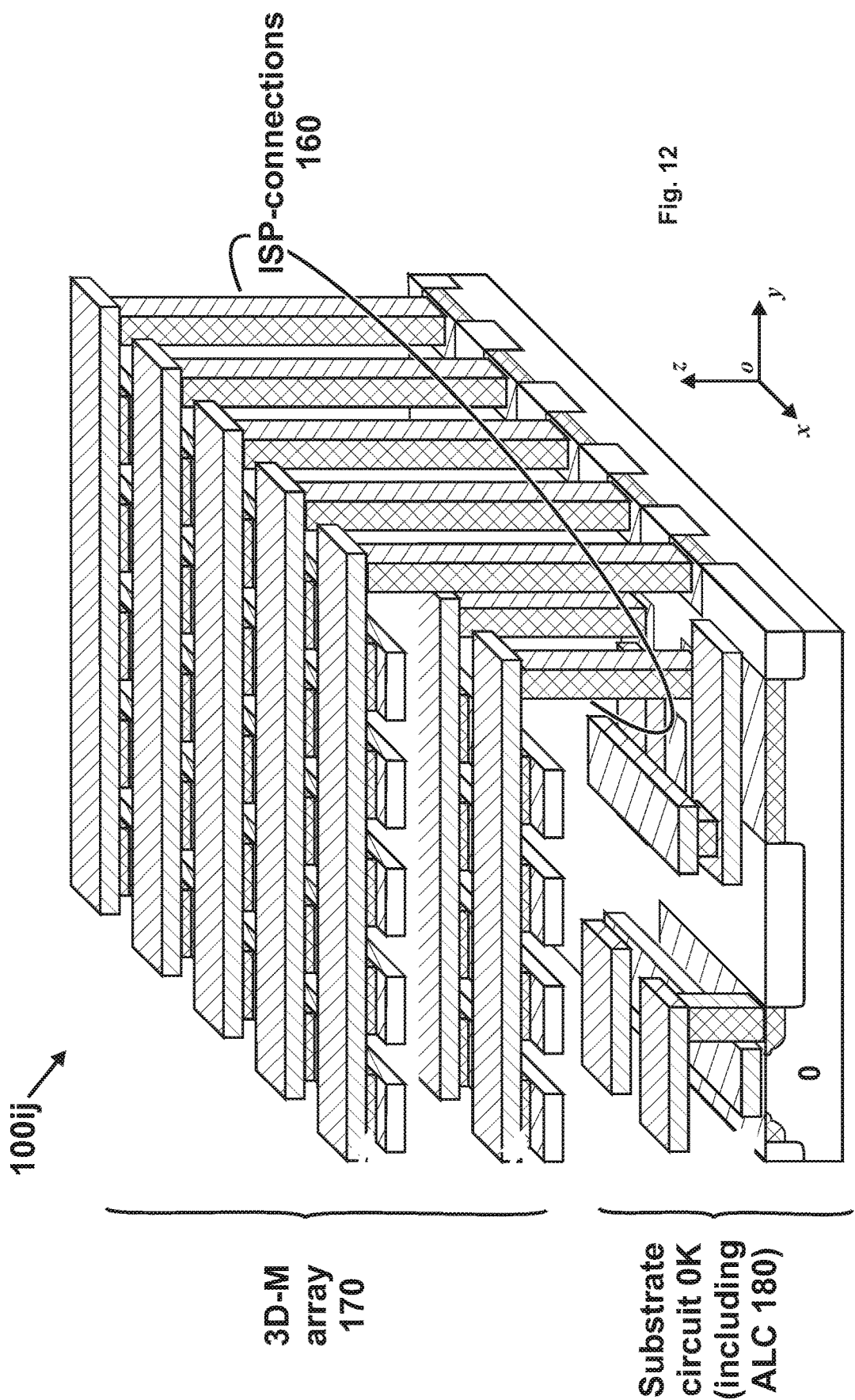
FIG. 12 is a perspective view of a preferred CCE in a preferred configurable-processor die.

FIG. 12 is a perspective view of a preferred CCE 100ij in the preferred configurable-processor die 100. The 3D-M array 170 is vertically stacked above the substrate circuit 0K. The substrate circuit 0K includes at least a portion of a peripheral circuit of the 3D-M array 170, ALC 180, CLE 200, and/or CIT 300. The 3D-M array 170 and the substrate circuit 0K substantially overlap. They are communicatively coupled through a plurality of ISP-connections (e.g. contact vias) 160. For reason of simplicity, only a 3D-$M_H$ array 170 is shown in this figure.

Not penetrating through any semiconductor substrate, the ISP-connections 160 (e.g. contact vias 1av, 3av) are short, small and numerous. To be more specific, the length of the contact vias 1av, 3av is on the order of one micrometer, e.g. ranging from ⅓ micrometers to 3 micrometers. Apparently, short contact vias 1av, 3av can be made small in size. In general, the size of the contact vias 1av, 3av is equal to or twice as much as the width of the address lines. For example, the size of the contact vias (e.g. 1av, 3av) is smaller than 100 nanometers. With small contact vias (e.g. 1av, 3av), more contact vias can be formed in each CCE 100ij. For example, a single CCE 100ij could comprise at least one thousand contact vias; and, a single configurable-processor die 100 could comprise at least one million contact vias. Thus, the preferred configurable-processor die 100 can achieve a large bandwidth between 3D-M array 170 and ALC 180.

The small contact vias (e.g. 1av, 3av) and the small 3D-M cells (~4 $F^2$, e.g. 7aa, 18ay) lead to a small CCE 100ij. Accordingly, the preferred configurable-processor die 100 comprises massive number of CCE's 100AA-100BD. In one example, the preferred configurable-processor die 100 comprises at least one thousand CCE's. In another example, the preferred configurable-processor die 100 comprises at least ten thousand CCE's. As a result, the preferred configurable processor 100 is computationally powerful, i.e. it can achieve massive parallelism, great computational complexity, and/or large computational density.

Referring now to FIGS. 13A-13D, several preferred configurable-processor doublets 100 are shown. A preferred configurable-processor doublet 100 comprises only two dice, i.e. a 3D-M die 100*a* and a processing die 100*b* bonded face-to-face. Namely, the preferred configurable-processor doublet 100 comprises only two semiconductor substrates, i.e. a first semiconductor substrate 0M of the 3D-M die 100*a* and a second semiconductor substrate OP of the processing die 100*b*. These dice 100*a*, 100*b* are placed face-to-face, i.e. the 3D-M die 100*a* faces upward (i.e. along the +z direction), while the processing die 100*b* is flipped so that it faces downward (i.e. along the −z direction). In the preferred configurable-processor doublet 100 of FIG. 13A, the dice 100*a*, 100*b* are bonded and communicatively coupled by a plurality of micro-bumps 160*x*, which collectively realize the ISP-connections 160.

Figure 13A:
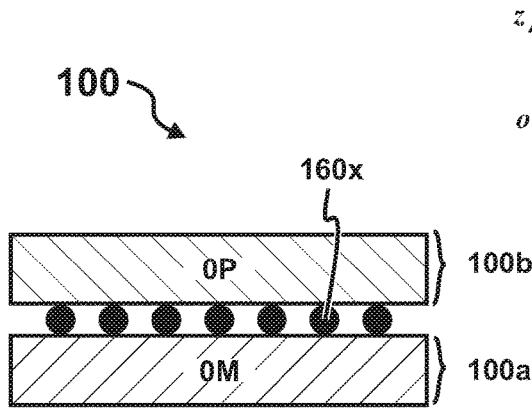
FIGS. 13A-13B are cross-sectional views of two preferred configurable-processor doublets.
Figure 13B:
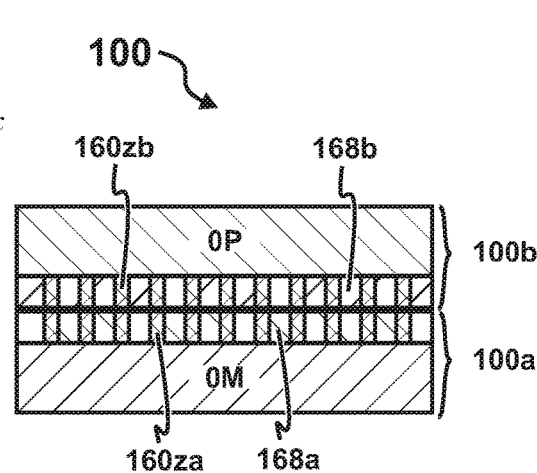

In the preferred configurable-processor doublet 100 of FIG. 13B, a first dielectric layer 168*a* is deposited on top of the 3D-M die 100*a*, first vias 160*za* are etched therein and filled with conductive material. Then a second dielectric layer 168*b* is deposited on top of the processing die 100*b*, second vias 160*zb* are etched therein and filled with conductive material. After flipping the processing die 100*b*, the first and second vias 160*za*, 160*zb* are aligned. By bonding the 3D-M die 100*a* and the processing dice 100*b*, the first and second vias 160*za*, 160*zb* become contacted. Accordingly, the first and second vias 160*za*, 160*zb* become contacted vias 160*za*, 160*zb*. They collectively form the ISP-connections 160.

Figure 13D:
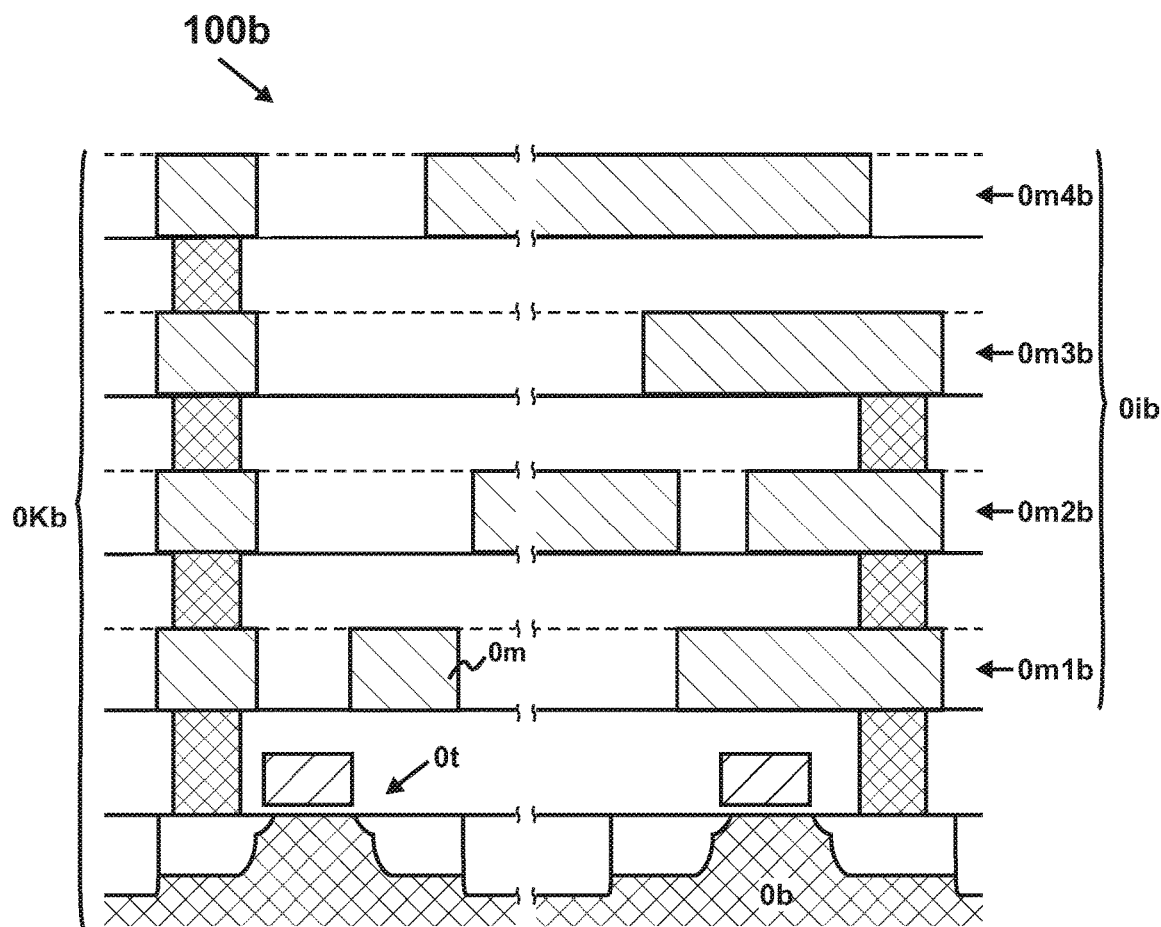
FIG. 13D is a cross-sectional view of a preferred processing die in the preferred configurable-processor doublet.
Figure 13C:
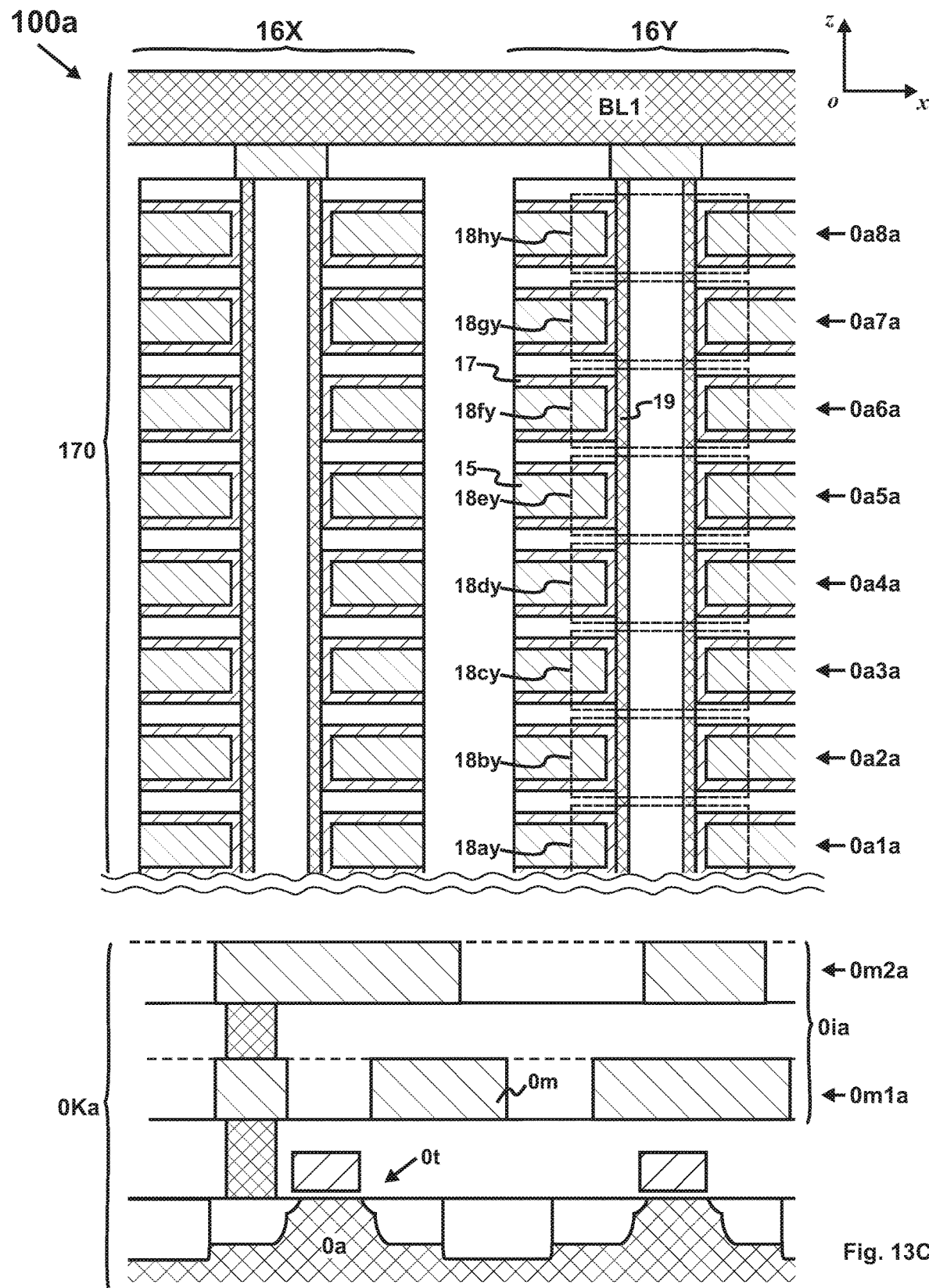
FIG. 13C is a cross-sectional view of a preferred 3D-M die in a preferred configurable-processor doublet.

The preferred 3D-M die 100*a* in FIG. 13C is similar to that in FIG. 11B. It is a 3D-NAND. It should be apparent to those skilled in the art that other types of the 3D-M (e.g. those disclosed in FIG. 11A or FIG. 11C) can be used. The preferred 3D-M die 100 comprises a substrate circuit 0Ka on the first semiconductor substrate 0M. The substrate circuit 0Ka further comprises transistors 0*t* and substrate interconnects 0*ia*. The transistors 0*t* are disposed on the first semiconductor substrate 0*a* and communicatively coupled by the substrate interconnects 0*ia*. The substrate interconnects 0*ia* include two interconnect layers 0*m*1*a*-0*m*2*a*, each of which comprises a plurality of interconnects (e.g. 0*m*) on a same physical plane. The substrate circuit 0Ka could comprise portions of peripheral circuits of the 3D-M arrays 170, the ALC's 180, the CLE'2 200, and/or the CIT's 300. Alternatively, the substrate circuit 0Ka could comprise none of the above. In any case, the substrate circuit 0Ka does not comprise full peripheral circuits of the 3D-M arrays 170. In other words, at least portions of the peripheral circuits of the 3D-M arrays 170 are formed in the processing die 100*b* of FIG. 13D.

The 3D-M arrays 170 are stacked above the substrate circuit 0Ka. The 3D-M arrays 170 include eight address-line layers 0*a*1*a*-0*a*8*a*. Each address-line layer (e.g. 0*a*1*a*) comprises a plurality of address lines on a same physical plane. The address-line layers 0*a*1*a*-0*a*8*a* form eight memory levels. Since they are formed above the first semiconductor substrate 0M and neither in contact with nor interposed therebetween by any semiconductor substrate, the memory cells (e.g. 18*ay*-18*hy*) of the 3D-M arrays 170 do not comprise any single-crystalline semiconductor material.

The preferred processing die 100*b* in FIG. 13D is a conventional 2-D circuit 0Kb. It comprises transistors 0*t* and interconnects 0*ib*. The transistors 0*t* are formed on the second semiconductor substrate 0*b* and communicatively coupled by the interconnects 0*ib*. In this preferred embodiment, the interconnects 0*ib* comprises four interconnect layers 0*m*1*b*-0*m*4*b*. Each interconnect layer (e.g. 0*m*1*b*) comprises a plurality of interconnects (e.g. 0*m*) on a same physical plane. Formed on a single-crystalline semiconductor substrate OP, the preferred 2-D circuit 0Kb comprises at least a single-crystalline semiconductor material. The preferred 2-D circuit 0Kb comprises at least first portions of peripheral circuits of the 3D-M arrays 170 and at least second portions of the ALC's 180. It may further comprise at least portions of the CLE's 200 and/or the CIT's 300. In sum, the preferred substrate circuit 0Ka in the preferred 3D-M die 100*a* and the preferred 2-D circuit 0Kb in the preferred processing die 100*b* constitute the full peripheral circuits of the 3D-M arrays 170, the full ALC's 180, the full CLE's 200 and the full CIT's 300 of the preferred configurable-processor doublet 100.

In the preferred configurable-processor doublet 100, the 3D-M die 100*a* comprises substantially more back-end-of-line (BEOL) layers (including all interconnect layers and all address-line layers) than the processing die 100*b*. For example, the 3D-M die 100*a* in FIG. 13C comprises ten BEOL layers (two interconnect layers 0*m*1*a*-0*m*2*a* and eight address-line layers 0*a*1*a*-0*a*8*a*), while the processing die 100*b* in FIG. 13D comprises only four BEOL layers 0*m*1*b*-0*m*4*b*. Since the 3D-M die 100*a* is more expensive than the processing die 100*b*, it is preferred to form at least a portion of the peripheral circuits of the 3D-M arrays 170 on the processing die 100*b*. Furthermore, designed and manufactured independently, the processing die 100*b* could comprise more interconnect layers than the 3D-M die 100*a*. For example, the processing die 100*b* of FIG. 13D comprises four interconnect layers 0*m*1*b*-0*m*4*b*, while the 3D-M die 100*a* of FIG. 13C comprises only two interconnect layers 0*m*1*a*-0*m*2*a*. As a result, the circuit layout on the processing die 100*b* is much easier than the 3D-M die 100*a*. Moreover, the processing die 100*b* may comprise high-speed interconnect materials (e.g. copper, aluminum), which are generally not compatible with high-temperature process; whereas, the substrate circuit 0*ia* of the 3D-M die 100*a* could only use high-temperature interconnect materials (e.g. tungsten), which, although compatible with high-temperature process (e.g. ~800° C.), generally have a higher electrical resistivity than the high-speed interconnect materials.

Since the 3D-M die 100*a* and the processing die 100*b* are face-to-face bonded and not separated by any semiconductor substrate, the ISP-connections 160 (e.g. micro-bumps 160*x* of FIG. 13A, contacted vias 160*za*, 160*zb* in FIG. 13B) in the preferred configurable-processor doublet 100 do not penetrate through any semiconductor substrate. Like the ISP-connections 160 in the preferred configurable-processor die 100, the ISP-connections 160 in the preferred configurable-processor doublet 100 are short (less than three micrometers in length), small (less than one micrometer in size), and numerous (more than one thousand in each CCE 100*ij* and more than one million for the whole doublet 100). Accordingly, the preferred configurable-processor doublet 100 can realize a large bandwidth between the 3D-M array 170 and the ALC 180. Moreover, because it comprises massive number of CCE's 100AA-100BD, generally on the order of thousands to tens of thousands, the preferred configurable-processor doublet 100 is computationally powerful, i.e. it can achieve massive parallelism, great computational complexity, and/or large computational density.

Figure 14A:
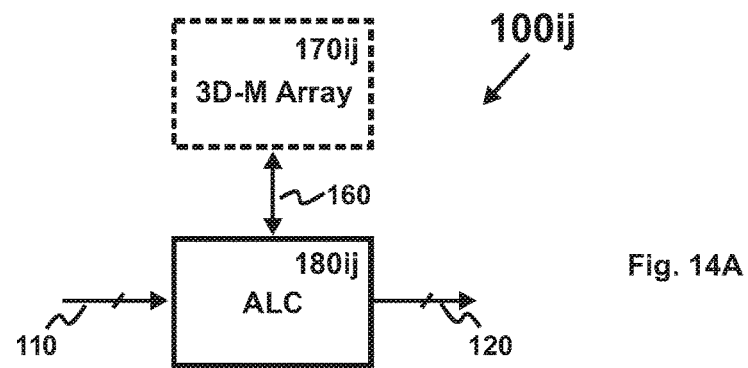
FIGS. 14A-14C are circuit block diagrams of three preferred CCE's.
Figure 14B:
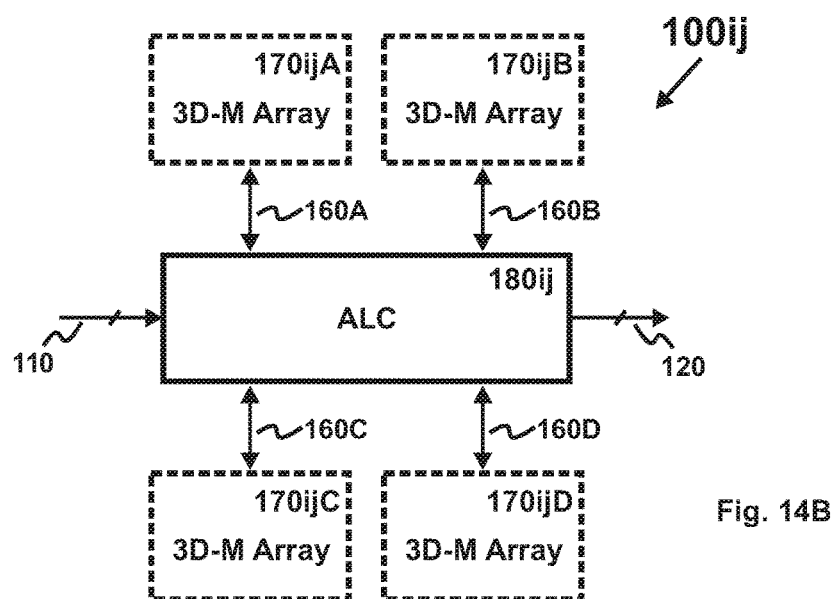
Figure 14C:
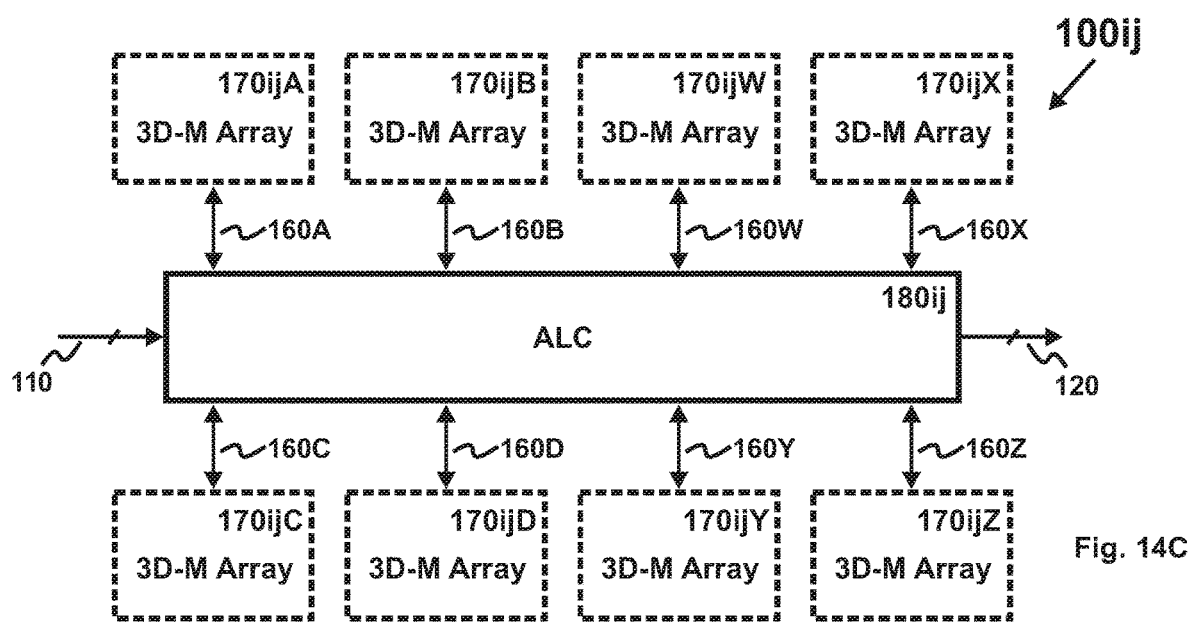
Figure 15A:
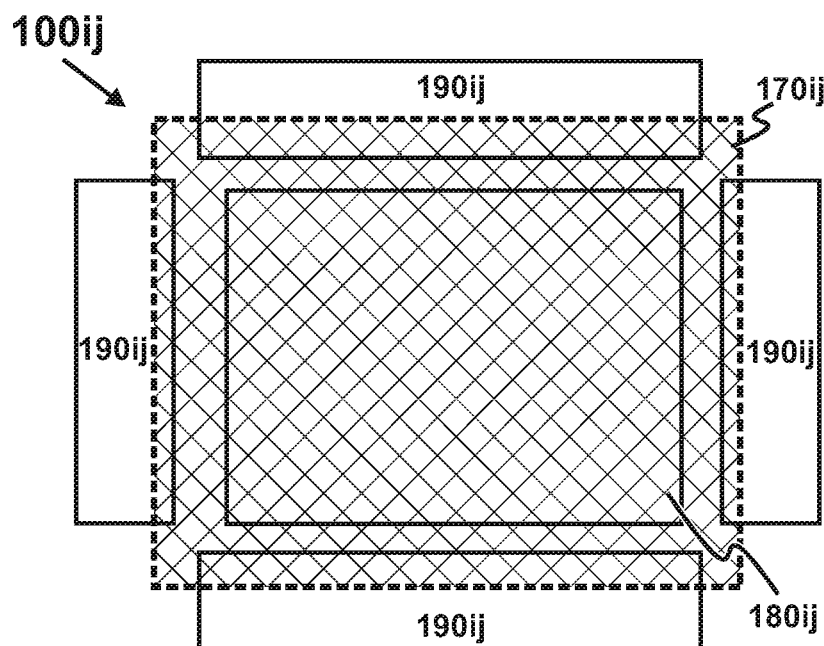
FIGS. 15A-15C are circuit layout views of three preferred CCE's.
Figure 15B:
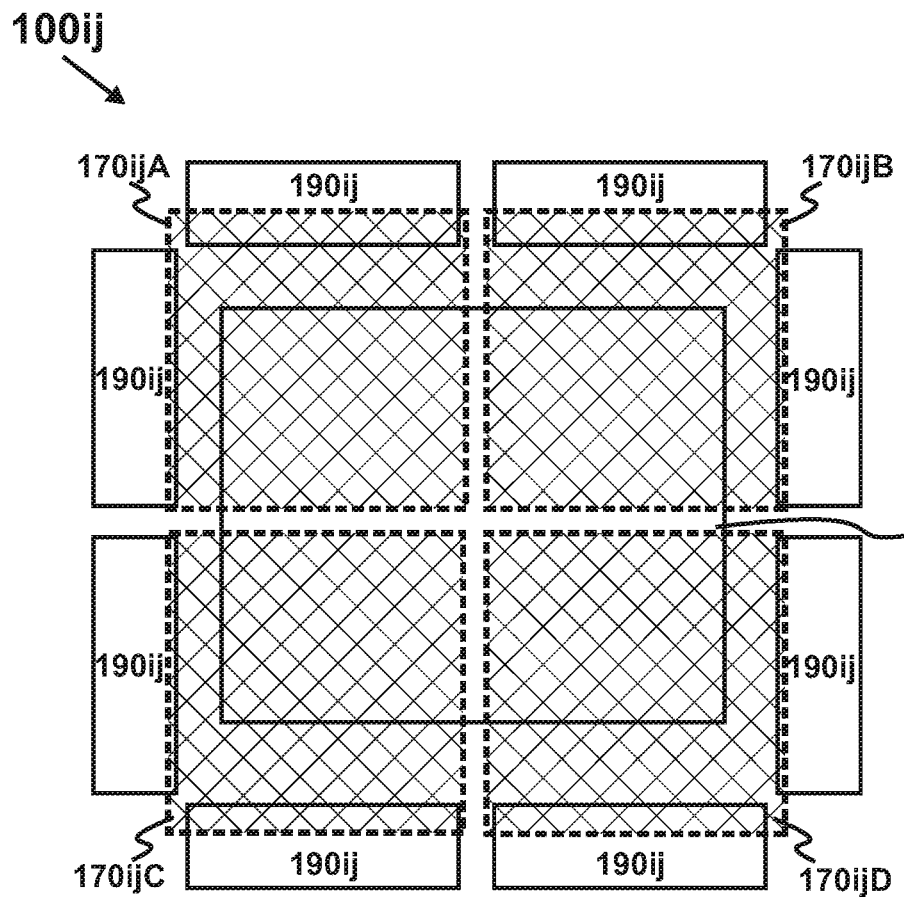
Figure 15C:
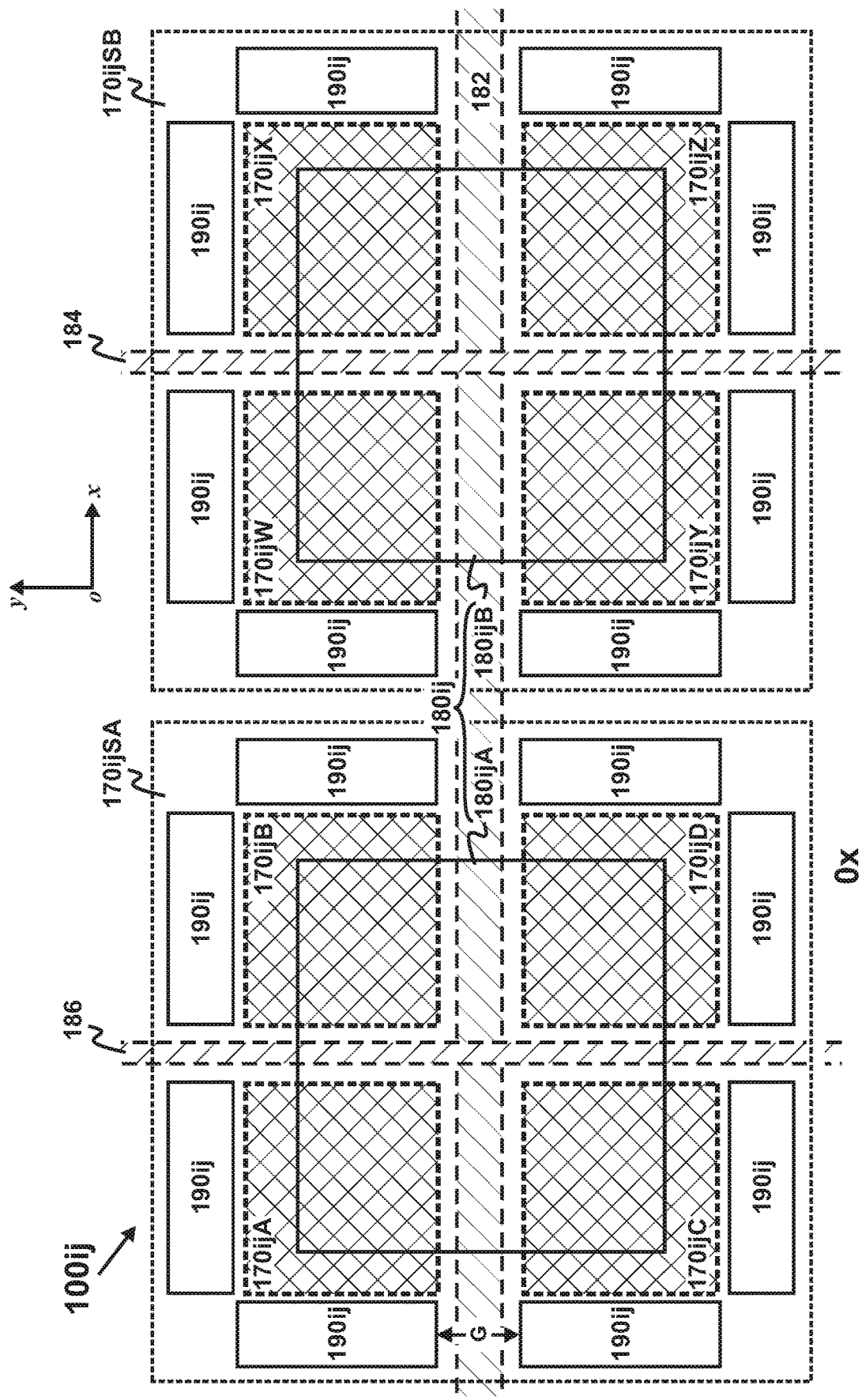

Referring now to FIGS. 14A-15C, three preferred CCE's 100$ij$ are shown. FIGS. 14A-14C are their circuit block diagrams and FIGS. 15A-15C are their circuit layout views. In these preferred embodiments, an ALC 180$ij$ serves different number of 3D-M arrays 170. In FIG. 14A, each CCE 100$ij$ comprises a single 3D-M array 170$ij$. The ALC 180$ij$ serves this single 3D-M array 170$ij$, i.e. it performs arithmetic operations on data stored in the 3D-M array 170$ij$. In FIG. 14B, each CCE 100$ij$ comprises four 3D-M arrays 170$ij$A-100$ij$D. The ALC 180$ij$ serves four 3D-M arrays 170$ij$A-170$ij$D, i.e. it performs arithmetic operations on data stored in four 3D-M arrays 170$ij$A-170$ij$D. In FIG. 14C, each CCE 100$ij$ comprises eight 3D-M arrays 170$ij$A-100$ij$D, 170$ij$W-170$ij$Z. The ALC 180$ij$ serves eight 3D-M arrays 170$ij$A-170$ij$D, 170$ij$W-170$ij$Z, i.e. it performs arithmetic operations on data stored in the 3D-M arrays 170$ij$A-170$ij$D, 170$ij$W-170$ij$Z. Located at a different physical level than the ALC 180$ij$ (referring to FIGS. 11A-13D), the 3D-M arrays 170$ij$-170$ij$Z are drawn by dashed lines.

FIGS. 15A-15C are the layouts showing the relative placements of the ALC 180, the peripheral circuit 190$ij$ of the 3D-M array 170$ij$, and the projection (in dashed lines) of the 3D-M array 170$ij$ on an ALC substrate Ox. For the preferred pattern-processor die 100 of FIGS. 11A-12, the ALC substrate Ox is the semiconductor substrate 0 of the preferred configurable-processor die 100; on the other hand, for the preferred configurable-processor doublet 100 of FIGS. 13A-13D, the ALC substrate Ox is the second semiconductor substrate OP of the preferred processing die 100$b$.

The embodiment of FIG. 15A corresponds to that of FIG. 14A. In this preferred embodiment, the ALC 180$ij$ and the peripheral circuit 190$ij$ of the 3D-M array 170$ij$ are disposed on the ALC substrate Ox. On the other hand, the 3D-M array 170$ij$ is located at a different physical level than the ALC 180$ij$. Its projection on the ALC substrate Ox substantially overlaps with the ALC 180$ij$ and in some cases, at least a portion of the peripheral circuit 190$ij$. The ISP-connections 160 (not drawn) communicatively couple the peripheral circuit 190$ij$ with the 3D-M array 170$ij$.

The embodiment of FIG. 15B corresponds to that of FIG. 14B. In this preferred embodiment, the ALC 180$ij$ and the peripheral circuits 190$ij$ of the 3D-M arrays 170$ij$A-170$ij$D are disposed on the ALC substrate Ox. On the other hand, the 3D-M arrays 170$ij$A-170$ij$D are disposed side-by-side. They are located at a different physical level than the ALC 180$ij$. The projections of the 3D-M arrays 170$ij$A-170$ij$D on the ALC substrate Ox substantially overlap with the ALC 180$ij$ and, in some cases, at least a portion of the peripheral circuit 190$ij$. Note that the peripheral circuit 190$ij$ of the 3D-M array 170$ij$A is only disposed along two projected edges (in dashed lines) of the 3D-M array 170$ij$A on the ALC substrate Ox; and, there is no peripheral circuit along the other two projected edges (in dashed lines) of the 3D-M array 170$ij$A. In the meantime, the ISP-connections 160 (not drawn) communicatively couple the peripheral circuit 190$ij$ with the associated 3D-M array 170$ij$A. Similar designs are made to the other 3D-M arrays 170$ij$B-170$ij$D.

The embodiment of FIG. 15C corresponds to that of FIG. 14C. The 3D-M arrays 170$ij$A-170$ij$D, 170$ij$W-170$ij$Z are divided into two sets: a first set 170$ij$SA includes four 3D-M arrays 170$ij$A-170$ij$D, and a second set 170$ij$SB includes four 3D-M arrays 170$ij$W-170$ij$Z. Below (or, above) the four 3D-M arrays 170$ij$A-170$ij$D of the first set 170$ij$SA, a first component 180$ij$A of the ALC 180$ij$ can be laid out. Similarly, below (or, above) the four 3D-M arrays 170$ij$W-170$ij$Z of the second set 170$ij$SB, a second component 180$ij$B of the ALC180$ij$ can be laid out. The first and second components 180$ij$A, 180$ij$B collectively form the ALC 180$ij$. In this preferred embodiment, adjacent peripheral circuits 190$ij$ of the 3D-M arrays are separated by physical gaps (e.g. G) for forming the routing channel 182, 184, 186, which provide coupling between different components 180$ij$A, 180$ij$B, or between different ALC's. Note that the peripheral circuit 190$ij$ of each 3D-M array is only disposed along two projected edges thereof (in dashed lines) on the ALC substrate Ox; and, there is no peripheral circuit along the other two projected edges thereof (in dashed lines). In the meantime, the ISP-connections 160 (not drawn) communicatively couple these peripheral circuits 190$ij$ with the associated 3D-M arrays.

In FIGS. 15A-15C, although only ALC 180 is shown, it should be understood that CLE 200 and/or CIT 300 can also be included within the region of the ALC 180. In other words, the CLE 200 and/or CIT 300 are also formed on the ALC substrate Ox and surrounded by the peripheral circuits 190. Besides the ALC 180, the projections of the 3D-M array 170 on the ALC substrate Ox could also overlap with at least portions of the CLE 200 and/or CIT 300.

For either configurable-processor singlet 100 or configurable-processor doublet 100, the 3D-M array 170 and the ALC 180 substantially overlap. In addition, because they do not penetrate through any semiconductor substrate, the ISP-connections 160 are short, small and numerous. Adding the fact that the 3D-NVM cells are much smaller than the RAM cells, the preferred CCE 100$ij$ is much smaller than prior art. Hence, the preferred configurable processor 100 contains massive number of the CCE's. In one preferred embodiment, the preferred configurable processor 100 contains at least one thousand CCE's. In another preferred embodiment, the preferred configurable processor 100 contains at least ten thousand CCE's. As a result, the preferred configurable processor 100 is computationally powerful, i.e. it can achieve massive parallelism, great computational complexity, and/or large computational density.

Because it can implement significantly more built-in mathematical functions than prior art (ten thousand vs. ten), the preferred configurable processor 100 will provide a paradigm shift in scientific computing. Scientific computing uses advanced computing capabilities to advance human understandings and solve engineering problems. It has wide applications in computational mathematics, computational physics, computational chemistry, computational biology, computational engineering, computational economics, computational finance and other computational fields.

The prevailing framework of scientific computing comprises three layers: a foundation layer, a function layer and a modeling layer. The foundation layer includes built-in mathematical functions that can be implemented by hardware. The function layer includes mathematical functions that cannot be implemented by hardware. The modeling layer includes mathematical models, which are the mathematical descriptions of the input-output characteristics of a system component within a system under simulation.

The conventional processor supports very few (~ten) built-in mathematical functions. This small set of built-in mathematical functions can be implemented by hardware and constitute the foundation layer of scientific computing. On the other hand, the mathematical functions in the function layer and the mathematical models in the modeling layer are both implemented by software. The function layer involves one software-decomposition step: mathematical functions are decomposed into combinations of built-in mathematical functions by software, before these built-in mathematical functions and the associated arithmetic operations are calculated by hardware. The modeling layer involves two software-decomposition steps: the mathematical models are first decomposed into combinations of mathematical functions; then the mathematical functions are further decomposed into combinations of built-in mathematical functions. Apparently, the software-implemented functions (e.g. mathematical functions, mathematical models) run much slower and less efficiently than the hardware-implemented functions (i.e. built-in mathematical functions), and extra software-decomposition steps (e.g. for mathematical models) would make these performance gaps even more pronounced.

Figures 16A, 16B:
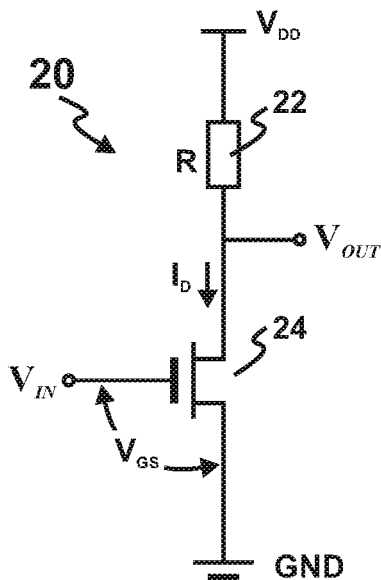
FIG. 16A is a circuit block diagram of an amplifier circuit.
FIG. 16B lists number of operations to calculate a current-voltage (I-V) point for various transistor models (prior art)

To illustrate how computationally intensive a mathematical model could be, FIGS. 16A-16B disclose a simple example—the simulation of an amplifier circuit 20. The amplifier circuit 20 comprises a transistor 24 and a resistor 22 (FIG. 16A). All transistor models (e.g. MOS3, BSIM3 V3.2, BSIM4 V3.0, PSP of FIG. 16B) model the transistor behaviors based on the small set of built-in mathematical functions provided by the conventional processor. Due to the limited choice of the built-in mathematical functions, calculating even a single current-voltage (I-V) point for the transistor 24 requires a large amount of computation (FIG. 16B). As an example, the BSIM4 V3.0 transistor model needs 222 additions, 286 multiplications, 85 divisions, 16 square-root operations, 24 exponential operations, and 19 logarithmic operations to calculate an I-V point. This large amount of computation makes simulation extremely slow and inefficient.

Significantly more built-in mathematical functions shall flatten the prevailing framework of scientific computing (including the foundation, function and modeling layers). The hardware-implemented functions, which were only available to the foundation layer, now become available to the function layer and modeling layer. Not only mathematical functions in the function layer can be directly realized by hardware, but also mathematical models in the modeling layer can be directly described by hardware. In the function layer, mathematical functions can be realized by a function-by-LUT method, i.e. the functional values are calculated by reading the LUT plus polynomial interpolation. In the modeling layer, mathematical models can be described by a model-by-LUT method, i.e. the input-output characteristics of the system component are modeled by reading the LUT plus polynomial interpolation. This would lead to a paradigm shift for scientific computing.

Figure 17:
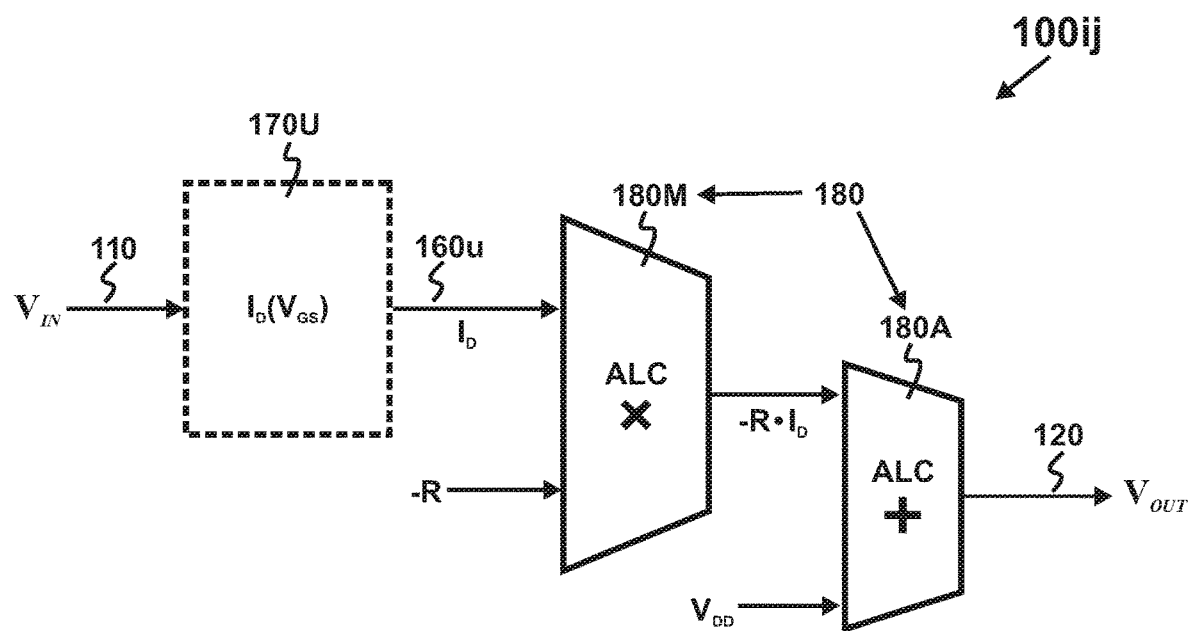
FIG. 17 is a circuit block diagram of a preferred CCE for implementing a mathematical model.

Referring now to FIG. 17, a preferred CCE 100*ij* to simulate the amplifier circuit 20 of FIG. 16A is disclosed. It uses the model-by-LUT method. The preferred CCE 100*ij* comprises a 3D-M array 170U, an adder 180A and a multiplier 180M. The 3D-M array 170U stores at least a mathematical model, which is considered as a form of the mathematical function. The mathematical model includes the data associated with the behaviors (e.g. input-output characteristics) of the transistor 24. By using the input voltage value ($V_{IN}$) as an address 150 for the 3D-M array 170U, the readout 160 of the 3D-M array 170U is the drain-current value ($I_D$). After the $I_D$ value is multiplied with the minus resistance value (−R) of the resistor 22 by the multiplier 180M, the multiplication result (−R*$I_D$) is added to the $V_{DD}$ value by the adder 180A to generate the output voltage value ($V_{OUT}$) 120.

The 3D-M array 170U could store different forms of mathematical models. In one case, the mathematical model data stored in the 3D-M array 170U are raw measurement data, i.e. the measured input-output characteristics of the transistor 24. One example is the measured drain current vs. the applied gate-source voltage ($I_D$-$V_{GS}$) characteristics. In another case, the mathematical model data stored in the 3D-M array 170U is the smoothed measurement data. The raw measurement data could be smoothed using a purely mathematical method (e.g. a best-fit model). Or, this smoothing process can be aided by a physical transistor model (e.g. a BSIM4 V3.0 transistor model). In a third case, the mathematical data stored in the 3D-M array 170U include not only the measured data, but also its derivative values. For example, the LUT data include not only the drain-current values of the transistor 24 (e.g. the $I_D$-$V_{GS}$ characteristics), but also its transconductance values (e.g. the $G_m$-$V_G$S characteristics). With derivative values, polynomial interpolation can be used to improve the modeling precision using a reasonably-sized LUT.

Model-by-LUT offers many advantages over function-by-LUT. By skipping two software-decomposition steps (from mathematical models to mathematical functions, and from mathematical functions to built-in mathematical functions), model-by-LUT saves substantial modeling time and energy. Moreover, model-by-LUT may need less LUT than function-by-LUT. In theory, mapping a mathematical function into an LUT requires an infinite space. In reality, mapping a mathematical model of a real life system component into an LUT requires only a finite space. To be more specific, because a transistor model (e.g. BSIM4 V3.0) has hundreds of model parameters, calculating the intermediate functions of the transistor model requires extremely large LUT's. However, if function-by-LUT is skipped (namely, skipping the transistor models and the associated intermediate functions), the transistor behaviors can be described using only three parameters (including the gate-source voltage $V_{GS}$, the drain-source voltage $V_{DS}$, and the body-source voltage $V_{BS}$). Describing the mathematical models of the transistor 24 requires relatively small LUT's.

While illustrative embodiments have been shown and described, it would be apparent to those skilled in the art that many more modifications than that have been mentioned above are possible without departing from the inventive concepts set forth therein. The invention, therefore, is not to be limited except in the spirit of the appended claims.

What is claimed is:

1. A configurable processor, comprising a single-crystalline semiconductor substrate and an array of configurable computing elements (CCE's), each of said CCE's comprising:

at least a three-dimensional memory (3D-M) array including memory cells for storing at least a portion of a look-up table (LUT) of a mathematical function, wherein said memory cells are neither in contact with nor interposed therebetween by any semiconductor substrate including said single-crystalline semiconductor substrate; and, said memory cells do not comprise any single-crystalline semiconductor material;

an arithmetic logic circuit (ALC) and at least a portion of a peripheral circuit of said 3D-M array disposed on said single-crystalline semiconductor substrate, wherein said ALC performs at least one arithmetic operation on selected data of said LUT; said ALC and said portion of said peripheral circuit are communicatively coupled; and, said ALC and said portion of said peripheral circuit comprise at least a single-crystalline semiconductor material;

a plurality of inter-storage-processor (ISP) connections for communicatively coupling said memory cells and said portion of said peripheral circuit, wherein said ISP-connections do not penetrate through any semiconductor substrate including said single-crystalline semiconductor substrate; and, said memory cells and said ALC at least partially overlap.

2. The configurable processor according to claim 1, further comprising at least an array of configurable logic elements (CLE's), wherein each of said CLE's selectively realizes a logic function from a logic library.

3. The configurable processor according to claim 1, further comprising at least an array of configurable interconnects (CIT's), wherein each of said CIT's selectively realizes an interconnect from an interconnect library.

4. The configurable processor according to claim 1, further comprising at least one multiplier disposed on said single-crystalline semiconductor substrate.

5. The configurable processor according to claim 1 being a singlet, comprising no more semiconductor substrate other than said single-crystalline semiconductor substrate.

6. The configurable processor according to claim 1 being a doublet, further comprising:
a processing die including said ALC and said portion of said peripheral circuit disposed on said single-crystalline semiconductor substrate;
a 3D-M die including said 3D-M array disposed on another semiconductor substrate different from said single-crystalline semiconductor substrate;
wherein said processing die and said 3D-M die are face-to-face bonded;
and, said doublet includes only said single-crystalline semiconductor substrate and said another semiconductor substrate.

7. The configurable processor according to claim 1, wherein said configurable processor comprises at least one thousand CCE's.

8. The configurable processor according to claim 1, wherein each of said CCE's comprises at least first and second 3D-M arrays disposed side-by-side and overlapping with said ALC.

9. The configurable processor according to claim 1, wherein said 3D-M array is a three-dimensional non-volatile memory (3D-NVM) array.

10. The configurable processor according to claim 1, wherein said memory cells comprise diodes or diode-like devices.

11. The configurable processor according to claim 1, wherein said memory cells comprise transistors or transistor-like devices.

12. The configurable processor according to claim 1, wherein said memory cells are re-programmable, whereby each of said CCE's can be re-configured to realize a different mathematical function by loading the LUT of said different mathematical function into said memory cells.

13. The configurable processor according to claim 1, wherein said mathematical function involves more operations than arithmetic operations performable by said ALC.

14. The configurable processor according to claim 1, wherein said LUT includes functional values and/or derivative values of said mathematical function.

15. The configurable processor according to claim 1, wherein said mathematical function includes a mathematical model.

16. The configurable processor according to claim 15, wherein said mathematical model includes raw measurement data and/or smoothed measurement data.

17. The configurable processor according to claim 1, wherein said ALC comprises at least an adder, a multiplier, and/or a multiplier accumulator (MAC).

18. The configurable processor according to claim 1, wherein:
each of said CCE's comprises at least one thousand ISP connections; and/or,
the length of said ISP connections is on the order of one micrometer.

19. The configurable processor according to claim 1, wherein said ISP connections include contact vias, contacted vias and/or micro-bumps.

* * * * *